United States Patent
Lee et al.

(10) Patent No.: US 12,382,794 B2
(45) Date of Patent: Aug. 5, 2025

(54) METHOD FOR MANUFACTRING DISPLAY DEVICE HAVING HOLE FORMED BY MULTIPLE WET ETCHING PROCESSES

(71) Applicant: SAMSUNG DISPLAY CO., LTD., Yongin-si (KR)

(72) Inventors: Jaebeen Lee, Seoul (KR); Eun-Kyung Yeon, Suwon-si (KR); Yi Joon Ahn, Seoul (KR); Sunghoon Kim, Chungcheongnam-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 244 days.

(21) Appl. No.: 17/207,686

(22) Filed: Mar. 21, 2021

(65) Prior Publication Data

US 2022/0005914 A1  Jan. 6, 2022

(30) Foreign Application Priority Data

Jul. 2, 2020  (KR) .......................... 10-2020-0081526

(51) Int. Cl.
*H10K 59/126* (2023.01)
*H10K 71/00* (2023.01)
*H10K 77/10* (2023.01)
*H01L 25/18* (2023.01)
*H10K 59/12* (2023.01)
*H10K 59/131* (2023.01)

(52) U.S. Cl.
CPC .......... *H10K 59/126* (2023.02); *H10K 71/00* (2023.02); *H10K 77/10* (2023.02); *H01L 25/18* (2013.01); *H10K 59/1201* (2023.02); *H10K 59/131* (2023.02)

(58) Field of Classification Search
CPC .. H10K 59/131; H10K 59/1201; H10K 77/10; H10K 71/00; H01L 25/18
See application file for complete search history.

(56) References Cited

U.S. PATENT DOCUMENTS

| 5,746,884 A | * | 5/1998 | Gupta | H01L 23/5226 257/E23.145 |
| 5,964,397 A | * | 10/1999 | Dautartas | H05K 13/0482 228/49.5 |
| 6,524,925 B1 | * | 2/2003 | Lee | H01L 28/20 257/E21.004 |

(Continued)

FOREIGN PATENT DOCUMENTS

| JP | 2005-217193 A2 | 8/2005 |
| JP | 2016-105183 | 6/2016 |

(Continued)

OTHER PUBLICATIONS

Office Action dated Aug. 14, 2024, in corresponding Korean Patent Application No. 10-2020-0081526, 7 pages.

*Primary Examiner* — Lex H Malsawma
(74) *Attorney, Agent, or Firm* — F. CHAU & ASSOCIATES, LLC

(57) ABSTRACT

A method for manufacturing a display device includes forming a first hole that extends into a substrate, through a first wet etching process using a first etchant and forming a second hole that extends from the first hole further into the substrate, through a second wet etching process using a second etchant. The second etchant has a pH different from a pH of the first etchant.

15 Claims, 23 Drawing Sheets

(56) References Cited

U.S. PATENT DOCUMENTS

| | | | |
|---|---|---|---|
| 7,514,287 B2* | 4/2009 | Huang | B81C 1/00587 257/E21.613 |
| 9,024,443 B2* | 5/2015 | Inaba | H01L 23/53295 257/773 |
| 9,142,490 B2 | 9/2015 | Park et al. | |
| 10,937,996 B2 | 3/2021 | Oshige | |
| 2003/0030455 A1* | 2/2003 | Tanioka | G01R 1/073 324/755.09 |
| 2003/0080092 A1* | 5/2003 | Arvin | C23F 1/44 216/105 |
| 2004/0256619 A1* | 12/2004 | Nomura | H01L 21/76804 257/E21.414 |
| 2006/0022575 A1* | 2/2006 | Ryu | H01J 29/481 313/495 |
| 2006/0125879 A1* | 6/2006 | Fujii | B41J 2/14274 347/54 |
| 2006/0125995 A1 | 6/2006 | Tai et al. | |
| 2008/0119056 A1* | 5/2008 | Bailey | H01L 24/11 257/E21.309 |
| 2011/0001247 A1* | 1/2011 | Jobetto | H01L 23/5389 257/774 |
| 2011/0133193 A1* | 6/2011 | Song | H01L 29/78669 257/E21.414 |
| 2012/0168412 A1* | 7/2012 | Hooper | B23K 26/382 219/121.68 |
| 2012/0225563 A1 | 9/2012 | Sotoaka et al. | |
| 2012/0329181 A1 | 12/2012 | Murakami et al. | |
| 2014/0080296 A1* | 3/2014 | Baek | H01L 21/823425 438/585 |
| 2015/0060402 A1* | 3/2015 | Burkett | B23K 26/302 216/41 |
| 2015/0166395 A1* | 6/2015 | Marjanovic | B23K 26/384 428/131 |
| 2017/0088457 A1* | 3/2017 | Mori | C03C 23/0025 |
| 2018/0342450 A1* | 11/2018 | Huang | H01L 23/49838 |
| 2019/0081205 A1* | 3/2019 | Totani | H01L 33/24 |
| 2019/0103370 A1* | 4/2019 | Huang | H01L 21/6835 |
| 2019/0103513 A1 | 4/2019 | Watanabe | |

FOREIGN PATENT DOCUMENTS

| | | |
|---|---|---|
| JP | 2019-186031 A2 | 10/2019 |
| KR | 100884229 | 2/2009 |
| KR | 10-2013-0142750 | 12/2013 |
| KR | 10-2015-0012573 A | 2/2015 |

* cited by examiner

METHOD FOR MANUFACTRING DISPLAY DEVICE HAVING HOLE FORMED BY MULTIPLE WET ETCHING PROCESSES

CROSS-REFERENCE TO RELATED APPLICATION(S)

This application claims priority under 35 U.S.C. § 119 from, and the benefit of, Korean Patent Application No. 10-2020-0081526, filed on Jul. 2, 2020 in the Korean Intellectual Property Office, the contents of which are herein incorporated by reference in their entirety.

TECHNICAL FIELD

Exemplary embodiments of the disclosure are directed generally to a display device and a method for manufacturing the same.

DISCUSSION OF THE RELATED ART

A display device is typically divided into a display area and a non-display area that surrounds the display area. The display device includes a substrate that overlaps the display area and the non-display area, a display panel disposed on a surface of the substrate and that overlaps the display area, and a driver disposed on the surface of the substrate and that overlaps the non-display area. The driver provides a signal or voltage to the display panel, and the display panel displays an image. The non-display area is typically a bezel of the display device.

SUMMARY

Some embodiments provide a method for manufacturing a display device with a reduced bezel.

Some embodiments provide a display device manufactured using the method.

A method for manufacturing a display device includes forming a first hole that extends into a substrate, through a first wet etching process that uses a first etchant and forming a second hole that extends from the first hole further into the substrate, through a second wet etching process that uses a second etchant, wherein the second etchant has a pH that differs from a pH of the first etchant.

According to an embodiment, the method may further include forming an etch stopper on the substrate, wherein a surface of the etch stopper contacts the substrate.

According to an embodiment, the first hole and the second hole penetrate the substrate and the surface of the etch stopper is exposed by the second hole.

According to an embodiment, the method may further include forming a filling metal that fills the inside of the first and second holes.

According to an embodiment, the method may further include irradiating a substrate with a laser, before forming the first hole exposing the inside of the substrate.

According to an embodiment, wherein the pH of the first etchant may be basic and the pH of the second etchant may be acidic.

According to an embodiment, According to an embodiment, the first etchant may include potassium hydroxide, and the second etchant may include hydrofluoric acid.

According to an embodiment, the etch stopper may include an organic material.

According to an embodiment, the method may further include forming a third hole that extends further into the substrate from the second hole, through a third wet etching process that uses a third etchant having a pH that is basic.

According to an embodiment, the third etchant may be a same as the first etchant.

According to an embodiment, the first hole, the second hole, and the third hole together may penetrate the substrate, and the surface of the etch stopper may be exposed by the third hole.

According to an embodiment, the etch stopper may include one of a metal or an inorganic material.

According to an embodiment, the pH of the first etchant may be acidic and the pH of the second etchant may be basic.

According to an embodiment, the second etchant includes potassium hydroxide, and the first etchant includes hydrofluoric acid.

According to an embodiment, the etch stopper may include one of a metal or an inorganic material.

According to an embodiment, the method may further include forming a third hole that extends further into the substrate from the second hole, through a third wet etching process that uses a third etchant that has a pH that is acidic.

According to an embodiment, the etch stopper may include an organic material

A display device according an embodiment includes a substrate that includes a hole that penetrates therethrough, and a filling metal disposed on a first surface of the substrate and that fills an inside of the hole. The hole may include a first hole and a second hole, and a first taper angle formed by a plane parallel to the first surface of the substrate and a side surface of the first hole and a second taper angle formed by an upper surface of the second hole and a side surface of the second hole may differ from each other.

According to an embodiment, the display device may further include an etch stopper disposed on the first surface of the substrate and that overlaps the hole.

According to an embodiment, the display device may further include a display panel disposed on a second surface of the substrate opposite to the first surface. The filling metal may be electrically connected to the display panel.

According to an embodiment, the hole may further include a third hole connected to the second hole, where the third hole extends further into the substrate from the second hole.

A method for manufacturing a display device includes irradiating a substrate with a laser; forming a hole in the substrate at a spot in the substrate irradiated by the laser, and forming an etch stopper on the substrate, where a surface of the etch stopper contacts the substrate. The hole includes a first hole that extends into the substrate and is formed through a first wet etching process that uses a first etchant and a second hole that extends from the first hole further into the substrate and is formed through a second wet etching process that uses a second etchant. The second etchant has a pH that differs from a pH of the first etchant, and the hole penetrates the substrate and the surface of the etch stopper is exposed by the hole.

In a method for manufacturing a display device according to embodiments, a first hole is formed in a substrate through a first wet etching process that uses a first etchant, and a second hole that is connected to the first hole is formed through a second wet etching process that uses a second etchant having a pH that differs from a pH of the first etchant. The substrate is penetrated by a hole that includes the first hole and the second hole. Since the hole is formed differently according to the pH of the etchant, a hole having a desired shape can be formed using etchants having different pHs. For example, a hole having a desired taper angle and a desired width can be formed. Accordingly, a filling metal can be easily formed inside the hole, and a spacing between the holes can be reduced. Therefore, since a display device may include a display panel disposed on a first surface of the substrate and a driving member disposed on a second surface of the substrate, a bezel of the display device can be reduced.

DETAILED DESCRIPTION

Illustrative, non-limiting embodiments will be more clearly understood from the following detailed description in conjunction with the accompanying drawings.

Figure 1:
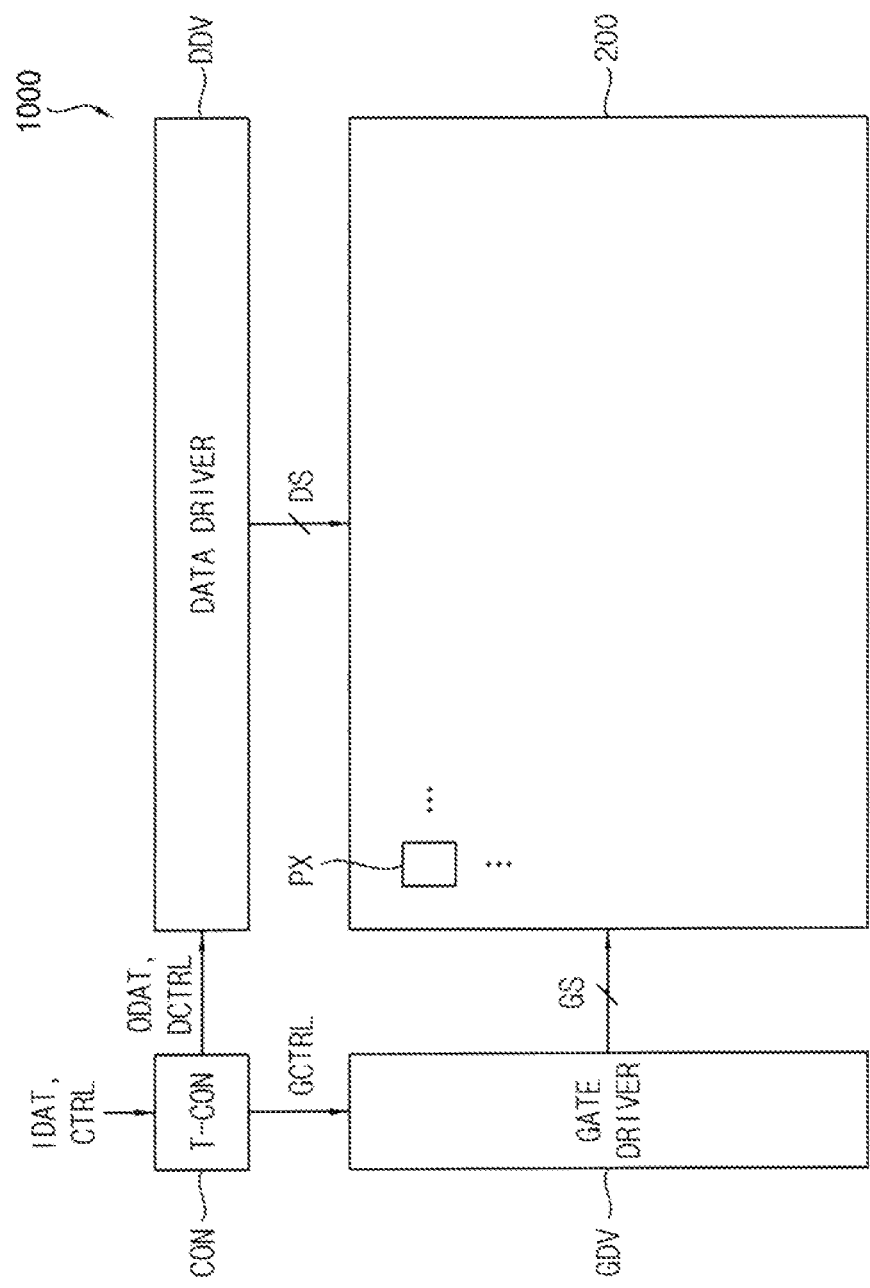
FIG. 1 is a block diagram of a display device according to example embodiments.

FIG. 1 is a block diagram illustrating a display device according to embodiments.

Referring to FIG. 1, a display device 1000 according to embodiments includes a display panel 200, a gate driver GDV, a data driver DDV, and a timing controller CON.

According to embodiments, a plurality of pixels PX are disposed on the display panel 200. For example, each of the pixels PX receives a gate signal GS and a data voltage DS from the gate driver GDV and the data driver DDV, respectively. Each of the pixels PX emits light based on the gate signal GS and the data voltage DS. For example, the light may be any one of red, green, or blue.

According to embodiments, the timing controller CON generates a gate control signal GCTRL, a data control signal DCTRL, and an output image data ODAT based on a control signal CTRL and input image data IDAT received from an external device. I can. For example, the control signal CTRL includes a vertical synchronization signal, a horizontal synchronization signal, an input data enable signal, a master clock signal, etc., and the input image data IDAT may be RGB data including red image data, green image data, and blue image data.

According to embodiments, the gate driver GDV generates gate signals GS based on the gate control signal GCTRL received from the timing controller CON. For example, the gate control signal GCTRL includes a vertical start signal and a clock signal.

According to embodiments, the gate driver GDV is electrically connected to the display panel 200 and sequentially outputs gate signals GS. Each of the pixels PX receives a data voltage DS under control of the gate signal GS.

According to embodiments, the data driver DDV generates data voltages DS based on the data control signal DCTRL and the output image data ODAT received from the timing controller CON. For example, the data control signal DCTRL includes an output data enable signal, a horizontal start signal, and a load signal.

According to embodiments, the data driver DDV is electrically connected to the display panel 200 and output the data voltages DS. Each of the pixels PX emits light having a luminance that corresponds to the data voltage DS.

Figure 2:
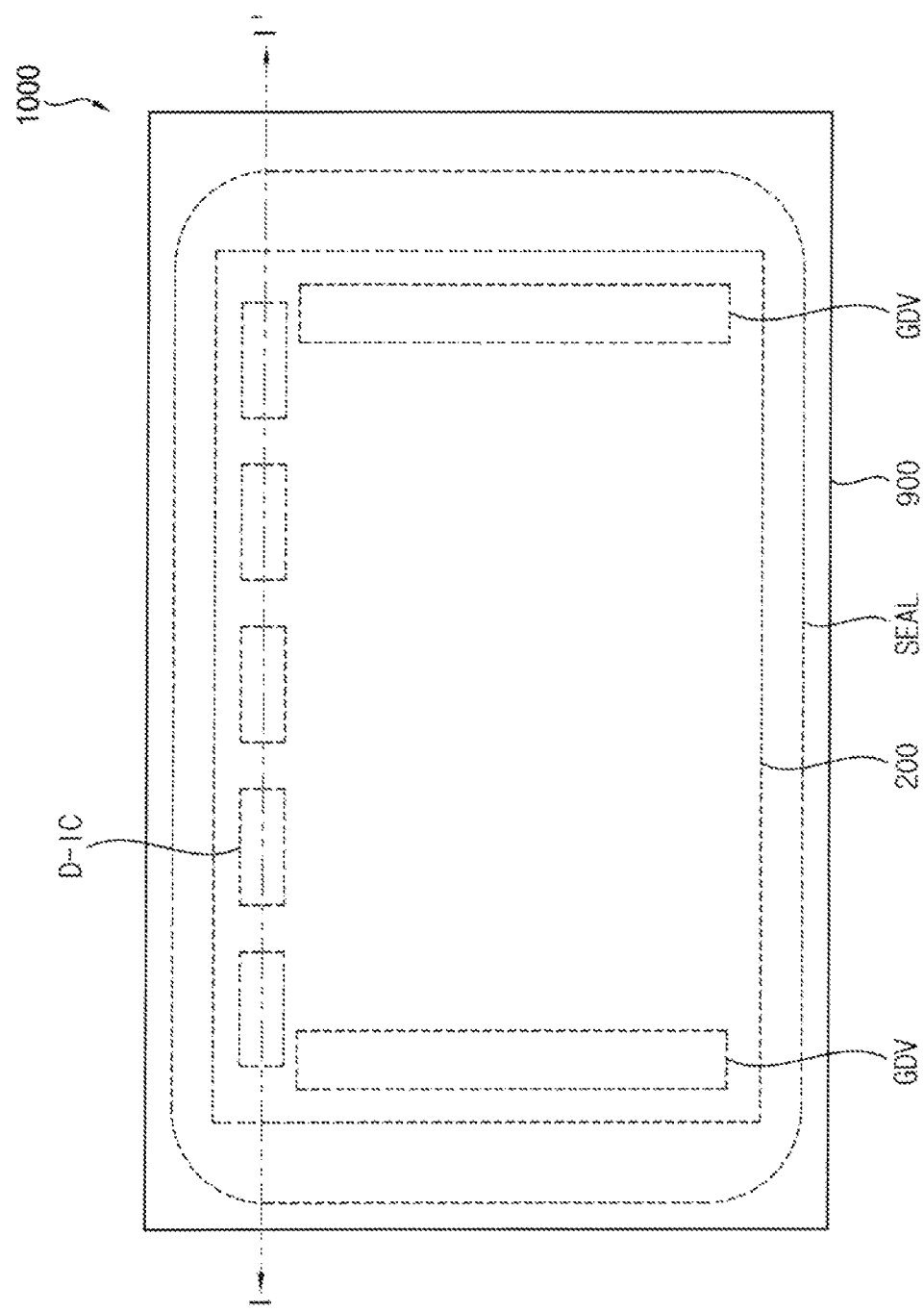
FIG. 2 is a plan view of a display device of FIG. 1.
Figure 3:
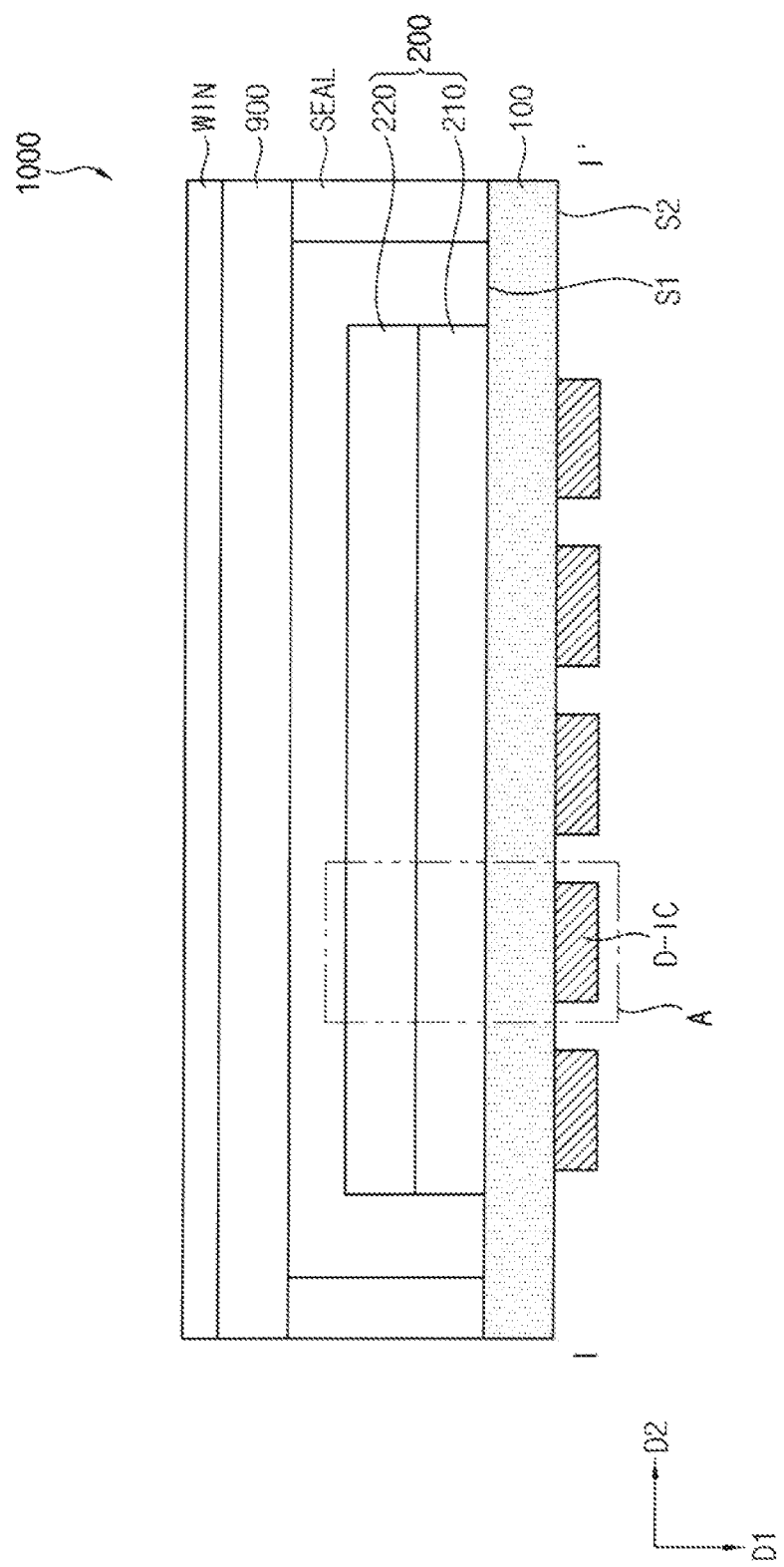
FIG. 3 is a cross-sectional view of a display device of FIG. 1.

FIG. 2 is a plan view of a display device of FIG. 1. FIG. 3 is a cross-sectional view of a display device of FIG. 1. For example, FIG. 3 is a cross-sectional view taken along line I-I' of FIG. 2.

Referring to FIGS. 1, 2, and 3, according to an embodiment, the display device 1000 includes a first substrate 100, the display panel 200, the gate driver GDV, a data driving circuit D-IC, a sealing member SEAL, a second substrate 900, and a window WIN. The display panel 200 includes a transistor layer 210 and an emission layer 220.

According to embodiments, the first substrate 100 may include glass, quartz, or plastic, etc. The first substrate 100 is a lower substrate that supports the display panel 200. In an embodiment, the first substrate 100 is a glass substrate that includes glass. In this case, the display device 1000 is a rigid display device or a large display device. In another embodiment, the first substrate 100 is a plastic substrate that includes plastic. In this case, the display device 1000 is a flexible display device or a small or medium-sized display device. Hereinafter, a case where the first substrate 100 is a glass substrate will be mainly described, but embodiments of the first substrate 100 are not limited thereto.

According to embodiments, the transistor layer 210 is disposed on a first surface S1 of the first substrate 100. In an embodiment, the transistor layer 210 includes a plurality of lines and a plurality of electrodes. For example, the lines and the electrodes constitute a plurality of transistors. The lines and the electrodes receive the gate signals GS and the data voltages DS. The transistor layer 210 generates a driving current that corresponds to the data voltage DS. The transistor layer 210 transmits the driving current to the emission layer 220 in response to the gate signal GS.

According to embodiments, the emission layer 220 is disposed on the device layer 210. In an embodiment, the emission layer 220 includes a first electrode electrically connected to the transistors, a pixel defining layer that includes openings that expose an upper surface of the first electrode, an organic emission layer disposed on the first electrode, and a second electrode disposed on the organic emission layer. For example, the first electrode, the organic emission layer, and the second electrode constitute an organic light emitting diode. The organic emission layer emits light that has a luminance that corresponds to the driving current. In another embodiment, the emission layer 220 includes a first electrode electrically connected to the transistors, a liquid crystal disposed on the first electrode, and a second electrode disposed on the liquid crystal.

According to embodiments, a driving member is disposed on a second surface S2 of the first substrate 100 opposite to the first surface S1. The driving member overlaps the display panel 200 and is electrically connected to the display panel 200 through a filling metal FM, shown in FIG. 4. For example, the filling metal FM is disposed inside a hole that penetrates the first substrate 100.

For example, according to embodiments, the driving member transmits a signal or a voltage to the display panel 200. The driving member includes the data driver DDV, the gate driver GDV, etc. As shown in FIGS. 2 and 3, the data driver DDV is implemented with a plurality of data driving circuits D-IC. The data driving circuits D-IC overlap the display panel 200 and are disposed on the second surface S2. In addition, the gate driver GDV overlaps the display panel 200 and is disposed on the second surface S2.

The driving member is not limited to embodiments described above. For example, the driving member can be any member electrically connected to the display panel 200 through the filling metal FM. In an embodiment, the display device 1000 has a back-bonding structure in which the display panel 200 and the driving member are disposed with the first substrate 100 interposed therebetween.

According to embodiments, the sealing member SEAL is disposed between the first substrate 100 and the second substrate 900. For example, an upper surface of the sealing member SEAL directly contacts a lower surface of the second substrate 900, and a lower surface of the sealing member SEAL directly contacts the first surface S1 of the first substrate 100. In addition, the sealing member SEAL surrounds the display panel 200 in a plan view. The sealing member SEAL prevents foreign materials from penetrating into the display device 1000 and protects the display panel 200 from the foreign materials.

According to embodiments, the second substrate 900 faces the first substrate 100 and is disposed on the display panel 200 and the sealing member SEAL. In an embodiment, the second substrate 900 is a color filter substrate. For example, the second substrate 900 includes a plurality of color filters.

According to embodiments, the window WIN is disposed on the second substrate 900. The window WIN absorbs external shocks and protects the display panel 200 from the external shocks.

According to embodiments, the display device 1000 further includes various functional layers. For example, the display device 1000 further includes a polarizing plate that polarizes external light to improve display quality, a transparent adhesive layer that transmits light and includes an adhesive material, a sensing layer that senses the user's approach and touch, and an encapsulation layer that prevents penetration of moisture and oxygen.

Figure 4:
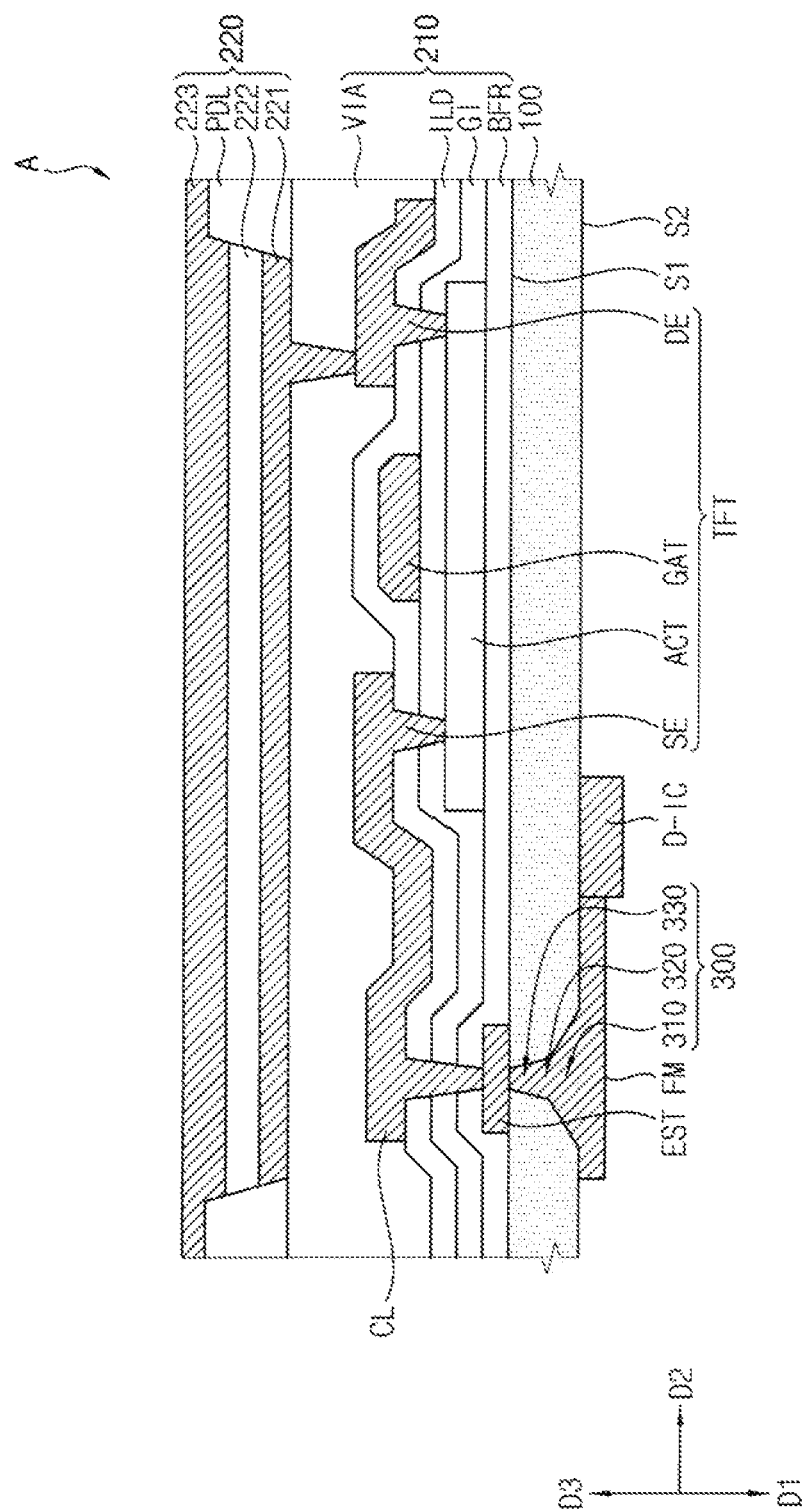
FIG. 4 is an enlarged view of an example of area A of FIG. 3.
Figure 5:
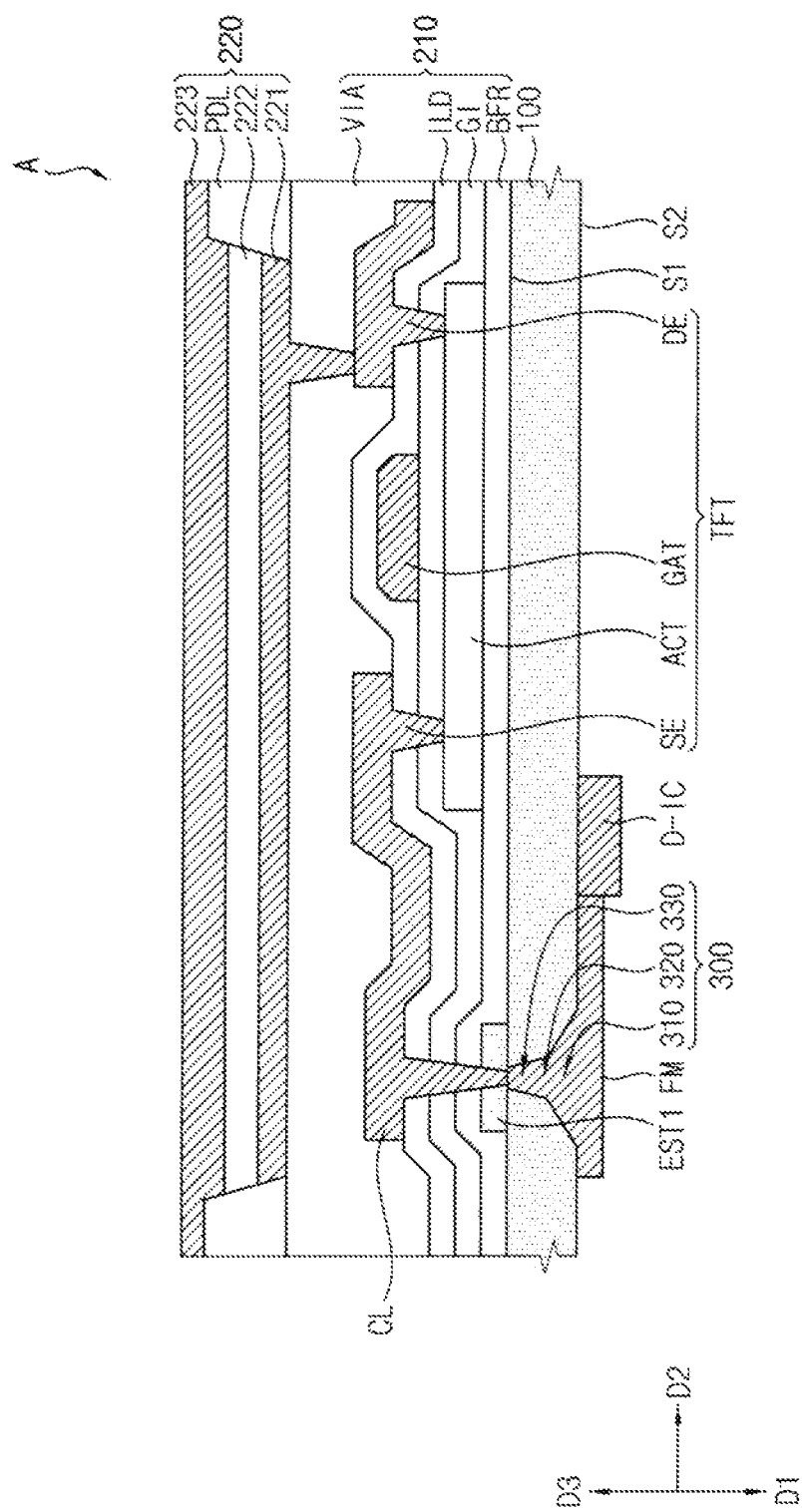
FIG. 5 is an enlarged view of another example of area A of FIG. 3.

FIG. 4 is an enlarged view of an example of area A of FIG. 3. FIG. 5 is an enlarged view of another example of area A of FIG. 3.

Referring to FIG. 4, according to embodiments, a hole 300 that penetrates the first substrate 100 is formed in the first substrate 100. The filling metal FM is disposed inside of the hole 300. An etch stopper EST is disposed on the first surface S1 of the first substrate 100, and contacts the filling metal FM. The transistor layer 210 includes a buffer layer BFR, an active pattern ACT, a gate insulating layer GI, an interlayer insulating layer ILD, a source electrode SE, a drain electrode DE, a gate electrode GAT, a connection line CL, and a via insulating layer VIA. The emission layer 220 includes a first electrode 221, a pixel defining layer PDL, an organic emission layer 222, and a second electrode 223.

According to embodiments, the etch stopper EST is disposed on the first surface S1 of the first substrate 100. The etch stopper EST protects the transistor layer 210 from being damaged while performing a wet etching process that forms the hole 300. Accordingly, the etch stopper EST includes a material that resists etchants used in the wet etching process. In addition, the etch stopper EST overlaps the hole 300. In an embodiment, as shown in FIG. 4, the etch stopper EST includes a metal and overlaps the hole 300. In another embodiment, as shown in FIG. 5, the etch stopper EST1 includes an inorganic material, and overlaps the hole 300. For example, the inorganic material is one or more of silicon oxide ("SiOx"), silicon nitride ("SiNx"), silicon oxynitride ("SiON"), aluminum oxide ("AlOx"), titanium oxide ("TiOx"), tantalum oxide ("TaOx"), hafnium oxide ("HfOx"), or zinc oxide ("ZnOx"). In this case, a hole that penetrates the etch stopper EST1 is further formed in the etch stopper EST1.

Referring to FIG. 4 again, according to embodiments, the buffer layer BFR covers the etch stopper EST and is disposed on the first surface S1 of the first substrate 100. The buffer layer BFR prevents metal atoms or impurities from diffusing from the first substrate 100 to the active pattern ACT. In addition, since the buffer layer BFR controls a heat supply rate during a crystallization process that forms the active pattern ACT, the active pattern ACT can be uniformly formed.

According to embodiments, the active pattern ACT is disposed on the buffer layer BFR. For example, the active pattern ACT includes a silicon semiconductor or an oxide semiconductor, etc. The silicon semiconductor includes amorphous silicon or polycrystalline silicon, etc. Ions are selectively implanted into the active pattern ACT. Accordingly, the active pattern ACT is divided into a source region into which the ions are implanted, a drain region into which the ions are implanted, and a channel region between the source region and the drain region.

According to embodiments, the gate insulating layer GI covers the active pattern ACT and is disposed on the first surface S1 of the first substrate 100. The gate insulating layer GI includes an insulating material. For example, the gate insulating layer GI include one or more of silicon oxide ("SiOx"), silicon nitride ("SiNx"), titanium oxide ("TiOx"), or tantalum oxide ("TaOx"), etc.

According to embodiments, the gate electrode GAT overlaps the channel region of the active pattern ACT and is disposed on the gate insulating layer GI. The gate electrode GAT includes a conductive material. For example, the gate electrode GAT may include a metal, an alloy, a conductive metal oxide, or a transparent conductive material, etc. In detail, the gate electrode GAT includes one or more of silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), or indium zinc oxide ("IZO"), etc.

According to embodiments, the interlayer insulating layer ILD covers the gate electrode GAT and is disposed on the gate insulating layer GI. The interlayer insulating layer ILD includes an insulating material.

According to embodiments, the source electrode SE and the drain electrode DE are disposed on the interlayer insulating layer ILD. The source electrode SE contacts the source region of the active pattern ACT through a first contact hole formed in the gate insulating layer GI and the interlayer insulating layer ILD. The drain electrode DE contacts the drain region of the active pattern ACT through a second contact hole formed in the gate insulating layer GI and the interlayer insulating layer ILD.

According to embodiments, the active pattern ACT, the gate electrode GAT, the source electrode SE, and the drain electrode DE constitute a thin film transistor TFT.

According to embodiments, the connection line CL is connected to the source electrode SE and is disposed on the gate insulating layer GI. For example, the connection line CL and the source electrode SE are a single metal pattern.

The connection line CL contacts the etch stopper EST through a third contact hole formed in the buffer layer BFR, the gate insulating layer GI, and the interlayer insulating layer ILD.

According to embodiments, the via insulating layer VIA covers the connection line CL, the source electrode SE, and the drain electrode DE, and is disposed on the interlayer insulating layer ILD. The via insulating layer VIA includes an organic insulating material. For example, the via insulating layer VIA includes one or more of a photoresist, a polyacryl-based regin, a polyimide-based resin, a polyamide-based resin, a siloxane-based resin, an acrylic-based resin, or an epoxy-based resin, etc. The via insulating layer VIA has a substantially flat upper surface.

According to embodiments, the driving member is disposed on the second surface S2 of the first substrate 100. As described above, the driving member is any member electrically connected to the display panel 200 through the filling metal FM. In an embodiment, as shown in FIG. 4, the driving member is the data driving circuit D-IC. In another embodiment, the driving member is the gate driving part GDV.

As described above, according to embodiments, the hole 300 is formed that penetrates the first substrate 100, and the filling metal FM is disposed inside of the hole 300. The filling metal FM electrically connects the etch stopper EST and the data driving circuit D-IC.

According to embodiments, the first electrode 221 is disposed on the via insulating layer VIA. The first electrode 221 contacts the drain electrode DE through a contact hole formed in the via insulating layer VIA. The first electrode 221 is formed of a conductive material. For example, the first electrode 221 may include a metal, an alloy, a conductive metal oxide, or a transparent conductive material, etc.

According to embodiments, the pixel defining layer PDL is disposed on the via insulating layer VIA. An opening is formed in the pixel defining layer PDL, and the first electrode 221 and the organic emission layer 222 are disposed in the opening.

According to embodiments, the organic emission layer 222 is disposed on the first electrode 221. The organic emission layer 222 includes a light-emitting material that emits at least one of red, green, or blue light.

According to embodiments, the second electrode 223 is disposed on the organic emission layer 222. The second electrode 223 includes a conductive material. For example, the second electrode 223 includes a metal, an alloy, a conductive metal oxide, or a transparent conductive material, etc.

Figure 6:
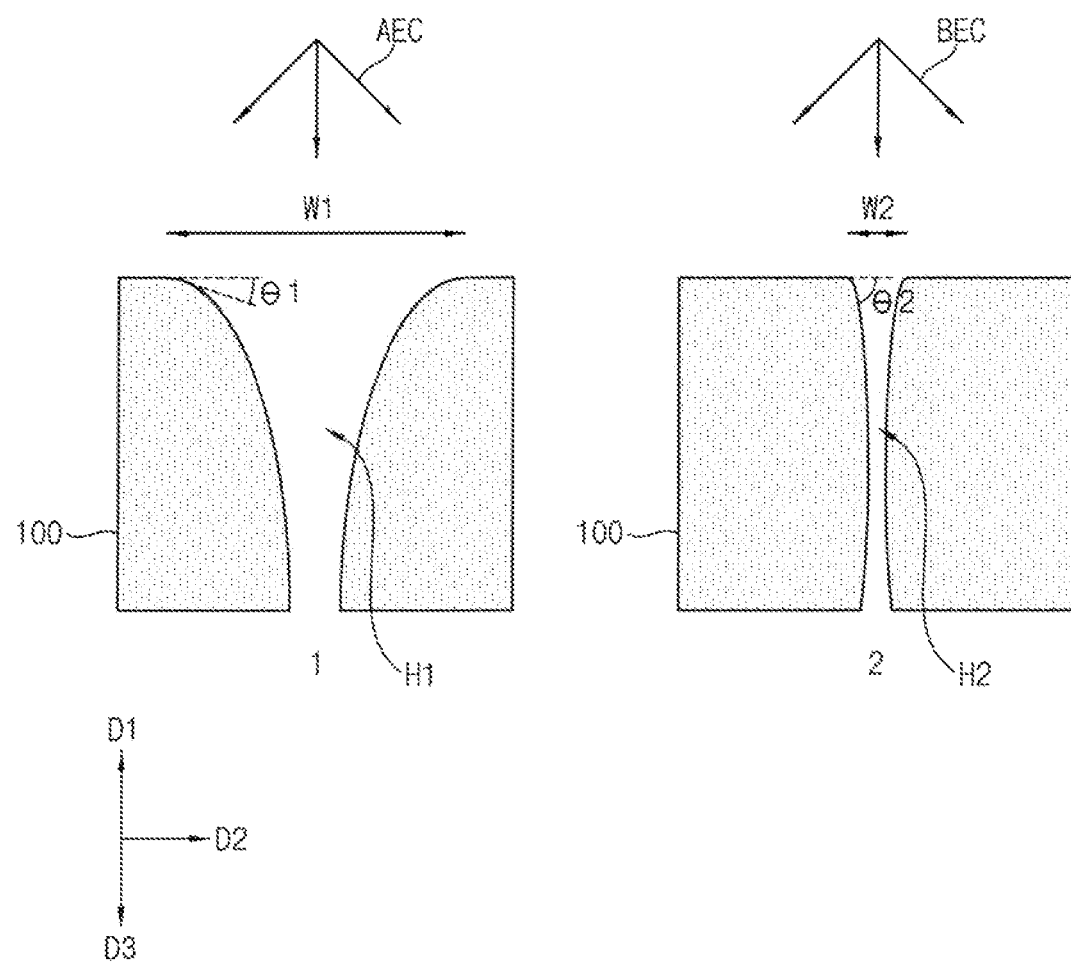
FIG. 6 is a cross-sectional view of a hole formed according to a pH of an etchant.

FIG. 6 is a cross-sectional view of a hole formed according to a pH of an etchant.

Referring to FIG. 6, a hole that penetrates the first substrate 100 is formed through a wet etching process. The wet etching process patterns an object, such as the first substrate 100, to be etched using an etchant that chemically reacts with the object to be etched. The etchant may be liquid or gas, and a pH of the etchant is less than 7, when the etchant is an acidic etchant, or greater than 7, when the etchant is a basic etchant.

In FIG. 6, according to embodiments, a first hole H1 is formed through a first wet etching process using an acidic etchant AEC having a pH less than 7, and a second hole H2 is formed through a first wet etching process using a basic etchant BEC having a pH greater than 7.

In the case of the first wet etching process, according to embodiments, the acidic etchant AEC has strong isotropic properties. In other words, the acidic etchant AEC etches the first substrate 100 in a depth direction D3 of the first substrate 100 and a width direction D2 perpendicular to the depth direction D3. Accordingly, an upper surface of the first hole H1 has a relatively large first width W1 and a relatively small first taper angle θ1. The taper angle is formed between the upper surface of the hole and a side surface of the hole.

In the case of the second wet etching process, according to embodiments, the basic etchant BEC has weak isotropic properties. In other words, the basic etchant BEC etches the first substrate 100 in the thickness direction D3. Accordingly, an upper surface of the second hole H2 has a relatively small second width W2 and a relatively large second taper angle θ2.

In the case of the first hole H1, according to embodiments, since the first taper angle θ1 is small, the filling metal easily forms inside of the first hole H1. On the other hand, since the first width W1 is large, a distance to another adjacent first hole is large.

In the case of the second hole 12, according to embodiments, since the second width W2 is small, the distance between the second hole H2 and another adjacent second hole is short. On the other hand, since the second taper angle θ2 is large, the filling metal might not form in the second hole H2.

In a method for manufacturing the display device 1000 according to exemplary embodiments, a first etchant and a second etchant having different pHs are used to form the hole 300 in the first substrate 100. In other words, in a method according to embodiments, the first wet etching process and the second wet etching process are sequentially performed. The order in which the first and second wet etching processes are performed may be changed as necessary. Accordingly, the filling metal easily forms in the hole 300, and the distance to another adjacent hole is short. A method according to embodiments will be described in detail below.

FIG. 7 to FIG. 16 are cross-sectional views that illustrate a method for manufacturing a display device of FIG. 4

Figure 7:
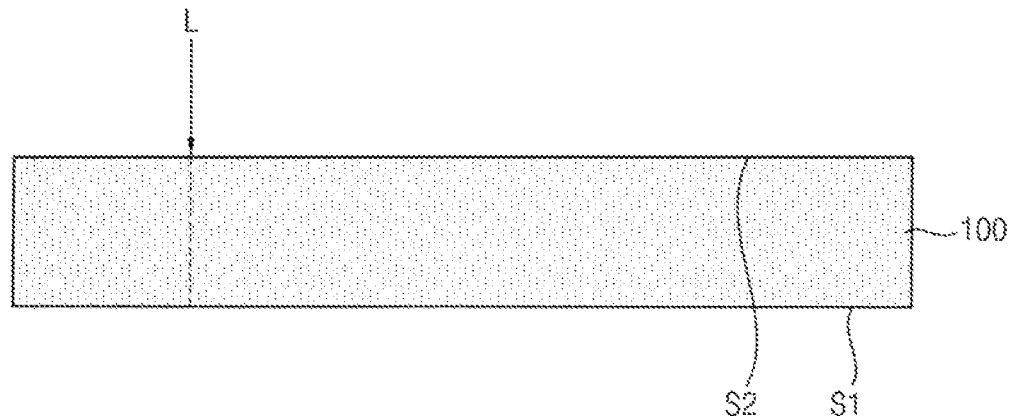
FIG. 7 to FIG. 16 are cross-sectional views that illustrate a method for manufacturing a display device of FIG. 4

Referring to FIGS. 4 and 7, according to embodiments, a laser L is irradiated to the first substrate 100. In detail, the laser L is irradiated to an area where the hole 300 is to be formed. The laser L selectively weakens the intermolecular bonding forces in the irradiated area of the first substrate 100. Accordingly, the hole 300 can be smoothly formed. Therefore, in a method according to embodiments, a mask is not required while performing a wet etching process.

Figure 8:
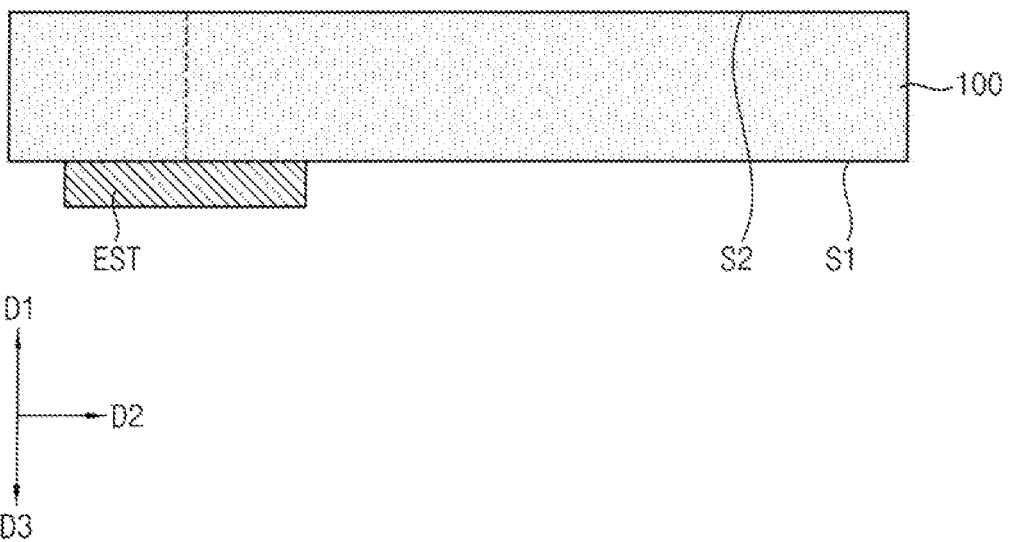

Referring to FIGS. 4 and 8, according to embodiments, the etch stopper EST is formed on the first surface S1 of the first substrate 100. In an embodiment, as shown in FIG. 8, the etch stopper EST is patterned to overlap the irradiated area of the first substrate 100.

Figure 9:
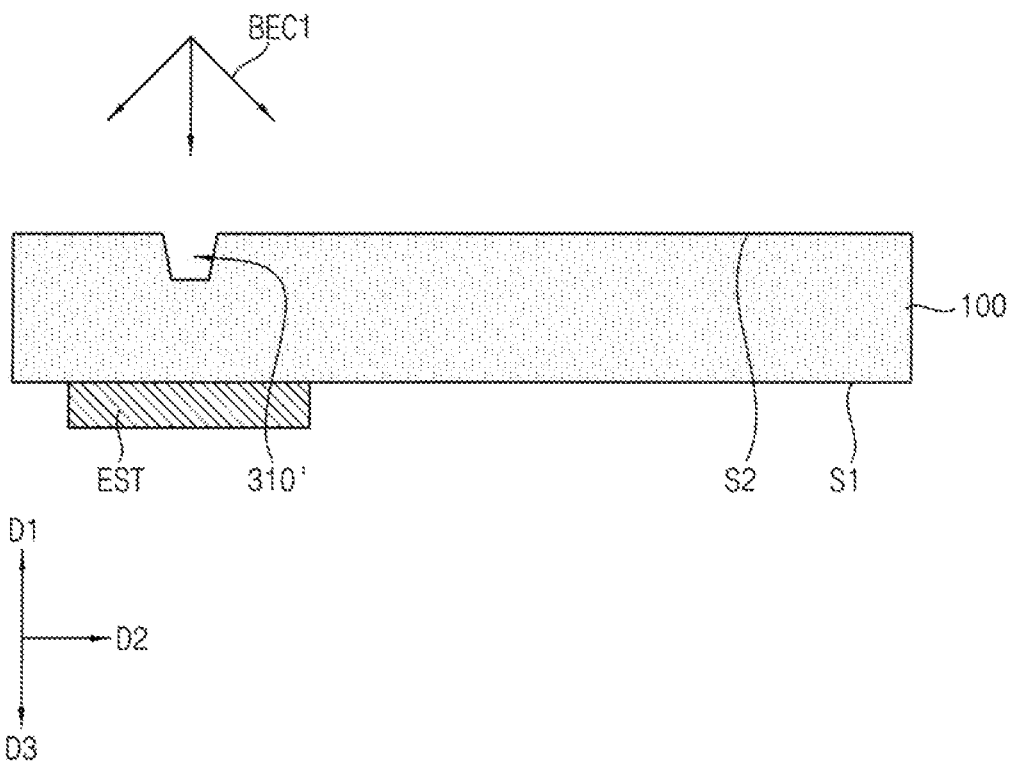

Referring to FIGS. 4 and 9, according to embodiments, a first wet etching process that uses a first etchant BEC1 is performed. In an embodiment, the pH of the first etchant BEC1 is greater than 7. In other words, the first etchant BEC1 is the basic etchant. For example, the first etchant BEC1 includes potassium hydroxide ("KOH"). When the first etchant BEC1 reacts with the first substrate 100, a first hole 310' that extends into the first substrate 100 and exposes the inside of the first substrate 100 is formed at a spot irradiated by the laser. After the first hole 310' is formed, the first substrate 100 is cleaned using a cleaning solution. Accordingly, any first etchant BEC1 that remains on the first substrate 100 can be removed.

Figure 10:
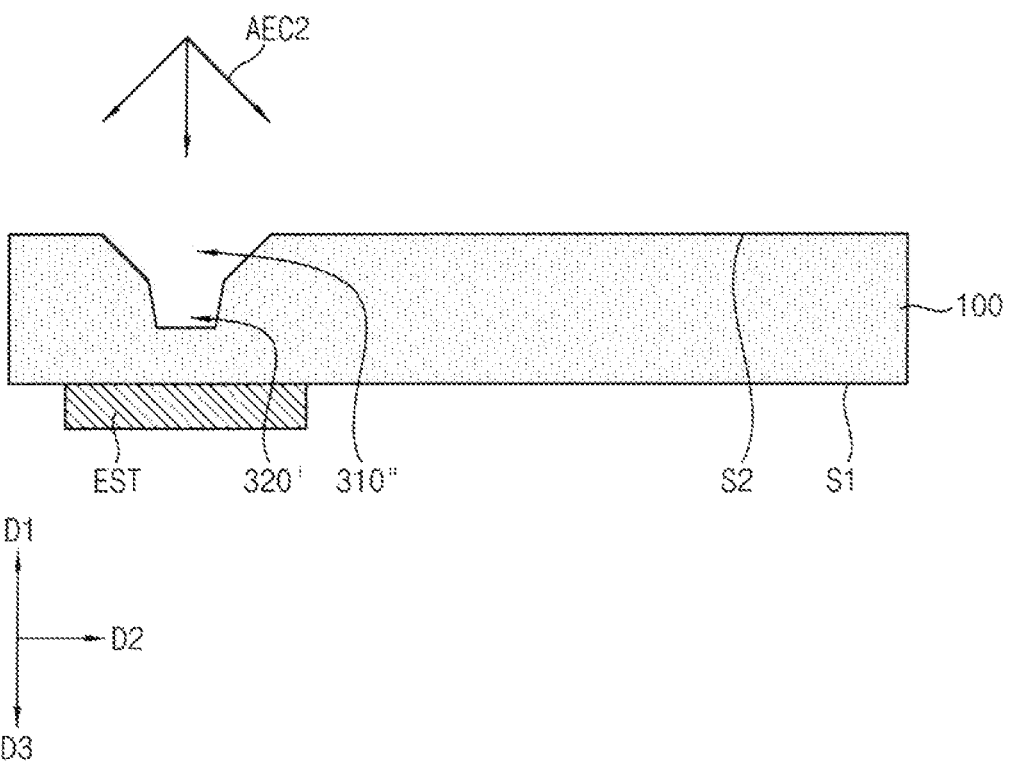

Referring to FIGS. 4 and 10, according to embodiments, a second wet etching process that uses the second etchant AEC2 is performed. In an embodiment, the pH of the second etching solution AEC2 is less than 7. In other words, the second etchant AEC2 is the acidic etchant. For example, the second etchant AEC2 includes hydrofluoric acid ("HF"). When the second etchant AEC2 reacts with the first substrate 100, the first hole 310' is widened into a first hole 310" and a taper angle of the first hole 310" is reduced. In addition, a second hole 320' connected to the first hole 310" is formed. The second hole 320' extends from the first hole 310" further into the first substrate 100. After the second hole 320' is formed, the first substrate 100 is cleaned using a cleaning solution. Accordingly, any second etchant AEC2 that remains on the first substrate 100 can be removed.

Figure 11:
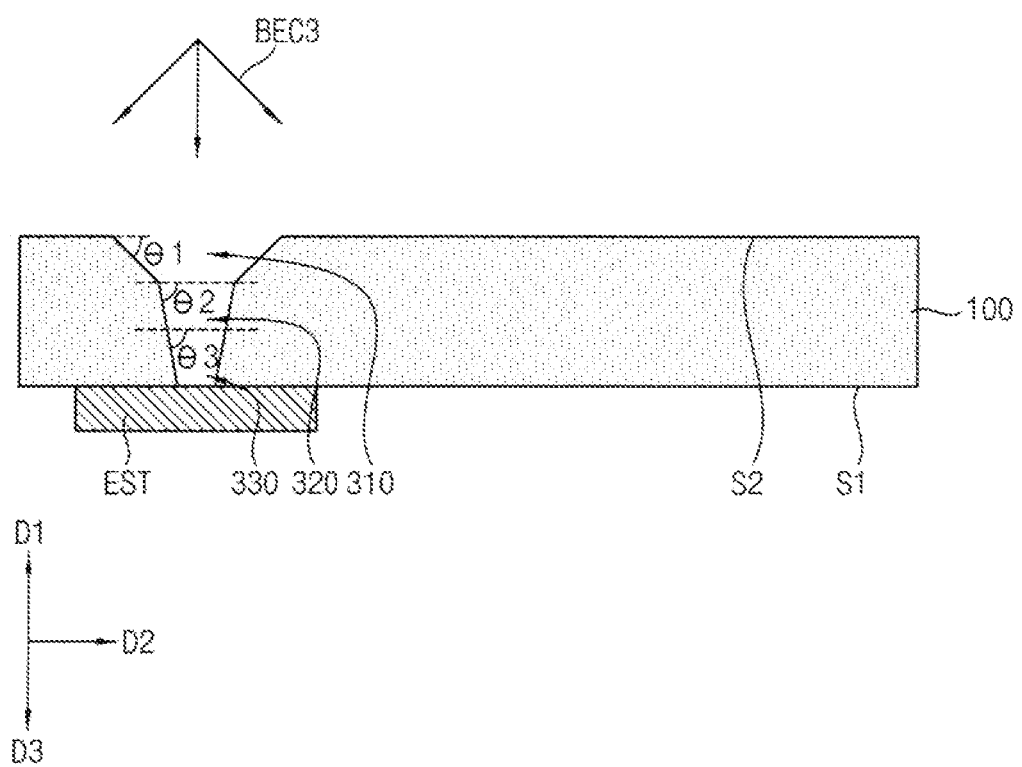

Referring to FIGS. 4 and 11, according to embodiments, a third wet etching process is performed using a third etchant BEC3. In an embodiment, the pH of the third etchant BEC3 is greater than 7. For example, the third etchant BEC3 is the same as the first etchant BEC1. When the third etchant BEC3 reacts with the first substrate 100, a first hole 310, a second hole 320, and a third hole 330 are formed from the first hole 310" and second hole 320'. The third hole 330 is connected to the second hole 320 and extends further into the first substrate 100 from the second hole 320.

In an embodiment, the first substrate 100 is penetrated by the first to third holes 310, 320, and 330. In other words, the upper surface of the first hole 310 coincides with the second surface S2 of the first substrate 100, the lower surface of the first hole 310 coincides with an upper edge of the second hole 320, a lower edge of the second hole 320 coincides with an upper edge of the third hole 330, and a lower edge of the third hole 330 coincides with the first surface S1 of the first substrate 100. In this case, a surface of the etch stopper EST in contact with the first substrate 100, such as a surface in contact with the first surface S1, is exposed by the third hole 330.

In an embodiment, a first taper angle θ1 formed between the upper surface of the first hole 310 and a side surface of the first hole 310 and a second taper angle θ2 formed between a plane parallel to the second surface S2 or the first surface S1 of the first substrate 100 and a side surface of the second hole 320 differ from each other. In addition, the second taper angle θ2 and a third taper angle θ3 formed between a plane parallel to the second surface S2 or the first surface S1 of the first substrate 100 and a side surface of the third hole 330 differ from each other. In other words, the side surface of the first hole 310, the side surface of the second hole 320, and the side surface of the third hole 330 have different inclinations from each other.

Figure 12:
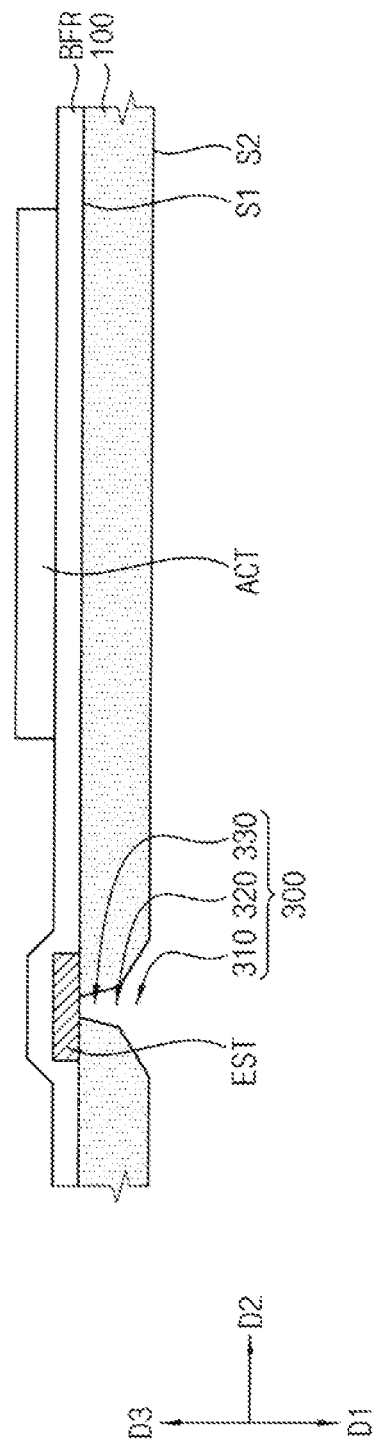

Referring to FIGS. 4 and 12, according to embodiments, the buffer layer BFR and the active pattern ACT are formed on the first surface S1 of the first substrate 100.

Figure 13:
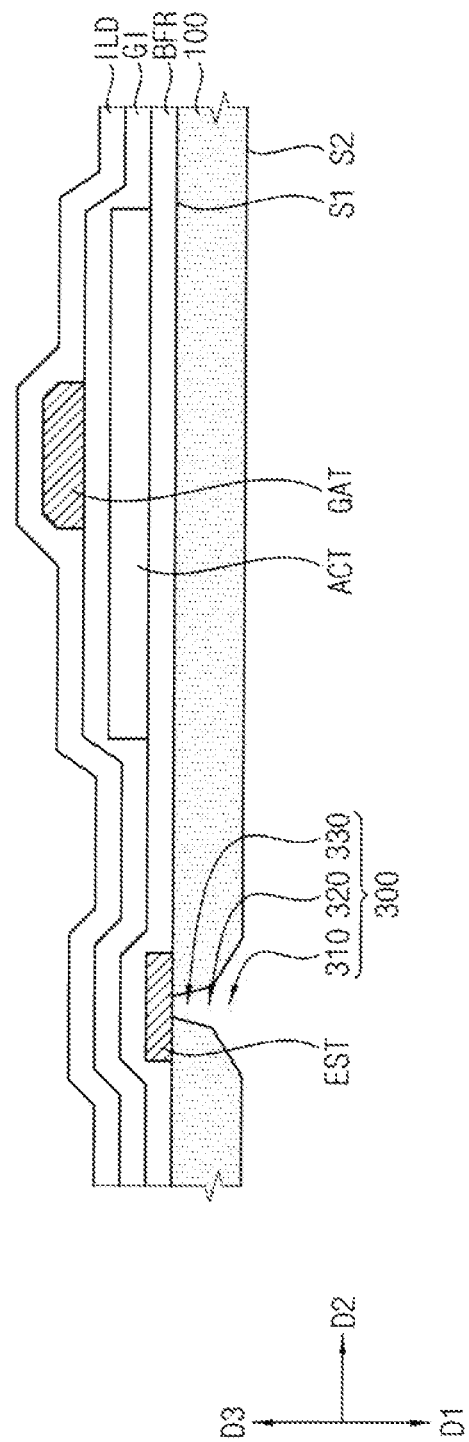

Referring to FIGS. 4 and 13, according to embodiments, the gate insulating layer GI is formed on the buffer layer BFR, the gate electrode GAT is formed on the gate insulating layer GI, and the interlayer insulating layer ILD is formed on the gate insulating layer GI and covers the gate electrode GAT.

Figure 14:
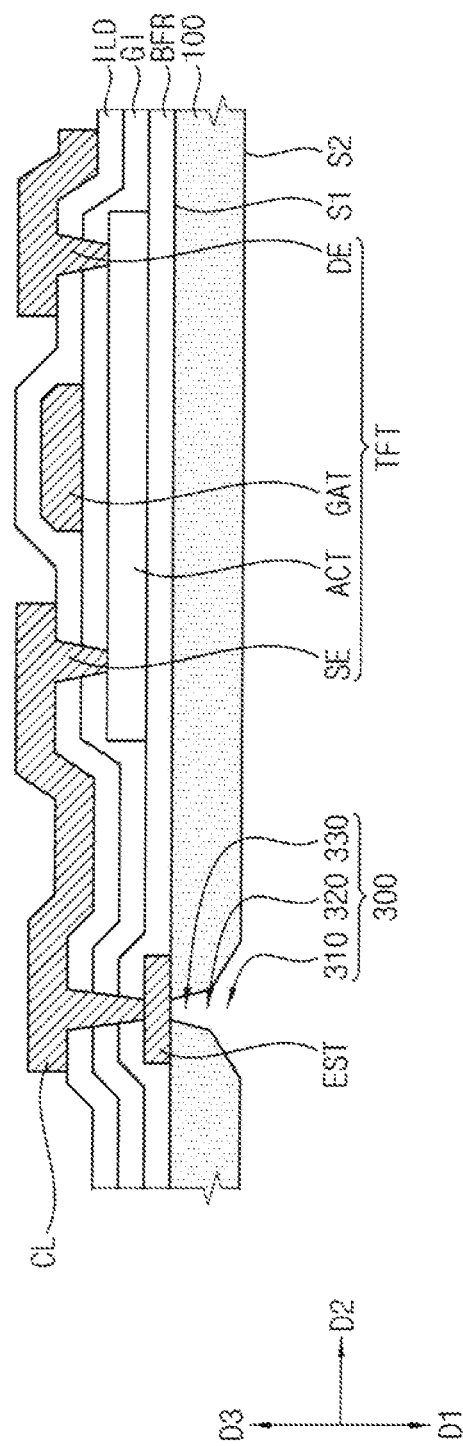

Referring to FIGS. 4 and 14, according to embodiments, after the first to third contact holes are formed in the buffer layer BFR, the gate insulating layer GI, and the interlayer insulating layer ILD, the source electrode SE, the drain electrode DE, and the connection line CL are formed. Accordingly, the source electrode SE contacts the source region of the active pattern ACT, the drain electrode DE contacts the drain region of the active pattern ACT, and the connection line CL contacts the etch stopper EST and connects the etch stopper to the source electrode SE.

Figure 15:
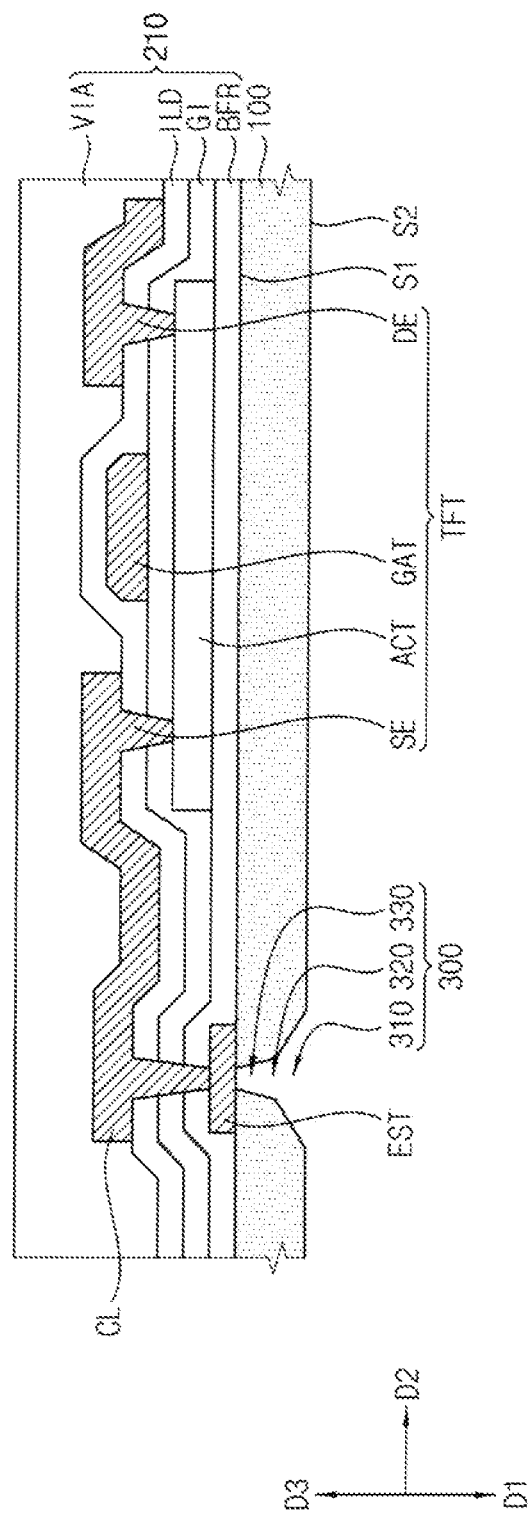

Referring to FIGS. 4 and 15, according to embodiments, the via insulating layer VIA is formed that covers the connection line CL, the source electrode SE, and the drain electrode DE. In other words, the transistor layer 210 is formed.

Figure 16:
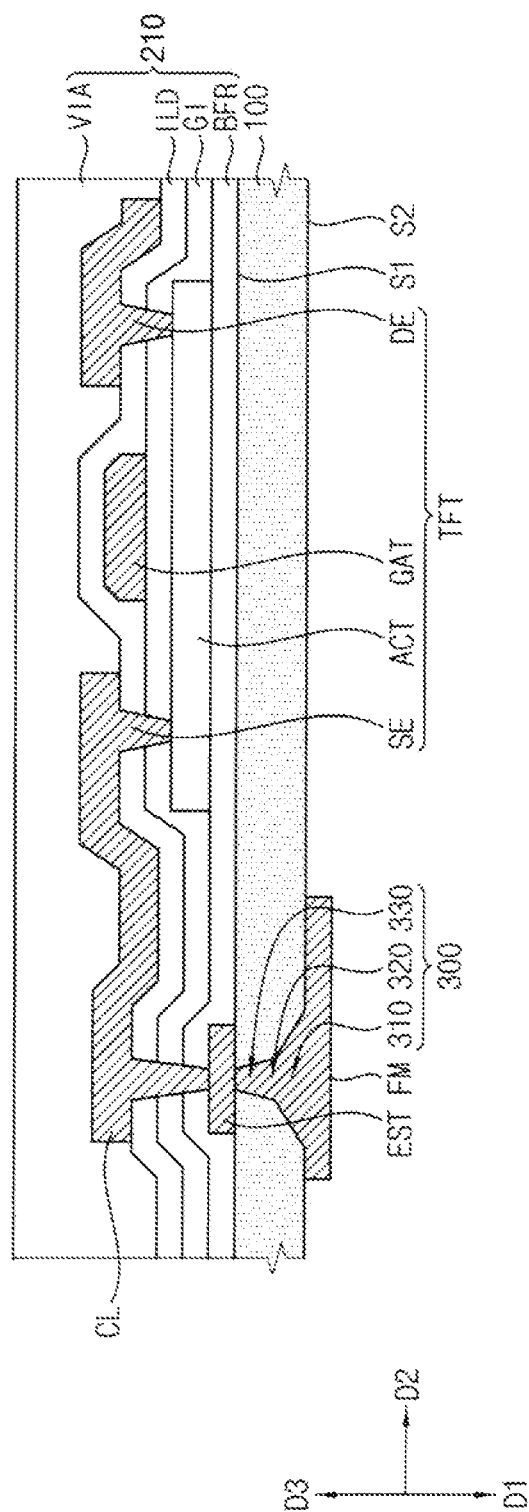

Referring to FIGS. 4 and 16, according to embodiments, the filling metal FM is formed inside of the hole 300. For example, the filling metal FM may be formed by a method such as low pressure chemical vapor deposition (LPCVD), atmospheric pressure chemical vapor deposition (APCVD), plasma enhanced chemical vapor deposition (PECVD), sputtering, or vacuum deposition, etc. The filling metal FM fills the inside of the hole 300 and contacts the etch stopper EST.

According to embodiments, although FIG. 4 shows the hole 300 as including the first to third holes 310, 320, and 330, embodiments of the present disclosure are not limited thereto. For example, the hole 300 does not include the third hole 330.

In detail, according to embodiments, the hole 300 includes only the first hole 310 and the second hole 320. For example, the first substrate 100 is penetrated by the first and second holes 310 and 320. In other words, the upper surface of the first hole 310 coincides with the second surface S2 of the first substrate 100, the lower edge of the first hole 310 coincides with the upper edge of the second hole 320, the lower surface of the second hole 320 coincides with the first surface S1 of the first substrate 100. In this case, the surface of the etch stopper EST in contact with the first substrate 100 is exposed by the second hole 320. In addition, to form the first and second holes 310 and 320, only the first wet etching process that uses the first etchant BEC1 and the second wet etching process that uses the second etchant AEC2 are performed.

According to embodiments, the third wet etching process that forms the third hole 330 may be omitted depending on the process conditions. For example, the third wet etching process may be omitted depending on the material of the etch stopper. In detail, when the etch stopper includes a material, such as an organic material, that can resist an acidic etchant, the third wet etching process is omitted.

In addition, according to embodiments, the order of performing the method steps is not limited to the above. For example, referring to FIGS. 11 to 15, after the hole 300 is formed, the transistor layer 210 is formed. For another example, after the transistor layer 210 is formed, the hole 300 is formed. The order described with reference to FIGS. 6 to 16 is merely an example of various procedures that can perform a method according to an embodiment, and those of ordinary skill in the art can appropriately change the order.

Figure 17:
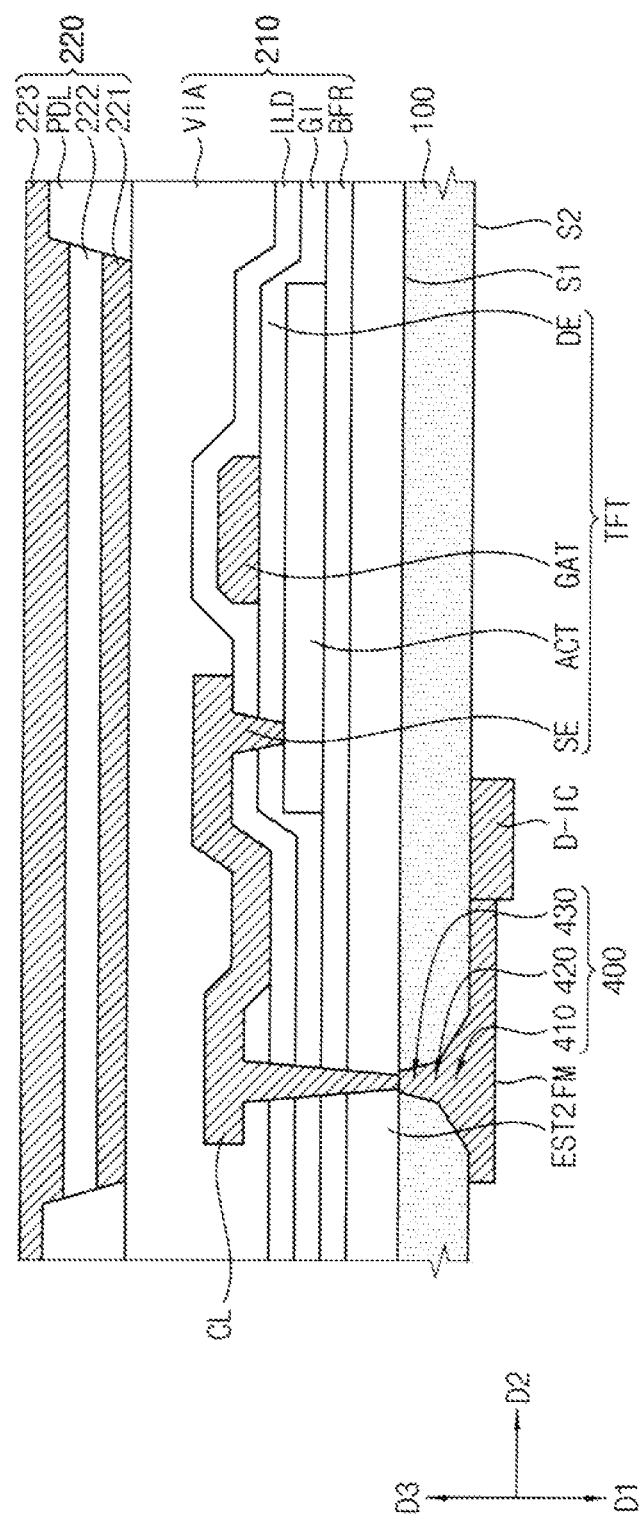
FIG. 17 is an enlarged view of still another example of area A of FIG. 3.

FIG. 17 is an enlarged view illustrating still another example of area A of FIG. 3.

Referring to FIGS. 3 and 17, according to embodiments, a hole 400 that penetrates the first substrate 100 is formed in the first substrate 100. The filling metal FM is disposed inside of the hole 400. An etch stopper EST2 is disposed on the first surface S1 of the first substrate 100. The transistor layer 210 includes the buffer layer BFR, the active pattern ACT, the gate insulating layer GI, the interlayer insulating layer ILD, the gate electrode GAT, the source electrode SE, the drain electrode DE, the connection line CL, and the via insulating layer VIA. The emission layer 220 includes the first electrode 221, the pixel definition layer PDL, the organic emission layer 222, and the second electrode 223. However, since the remaining configurations, except for the hole 400 and the etch stopper EST2, are the substantially same as configurations described with reference to FIG. 4, the hole 400 and the etch stopper EST2 will be described below.

According to embodiments, the etch stopper EST2 is disposed on the first surface S1 of the first substrate 100. The etch stopper EST2 protects the transistor layer 210 so that the transistor layer 220 is not damaged while performing a wet etching process that forms the hole 400. Accordingly, the etch stopper EST2 includes a material that can resist etchants used in a wet etching process. In addition, the etch stopper EST2 overlaps the hole 400. In an embodiment, as shown in FIG. 17, the etch stopper EST2 includes an organic material and is disposed on the entire first substrate 100. For example, the organic material is one of more of a photoresist, a polyacryl-based resin, a polyimide-based resin, a polyamide-based resin, a siloxane-based resin, an acrylic-based resin, or an epoxy-based resin, etc. In this case, a hole that penetrates the etch stopper EST2 is further formed.

FIG. 18 to FIG. 27 are cross-sectional views that illustrate a method for manufacturing a display device of FIG. 17.

Figure 18:
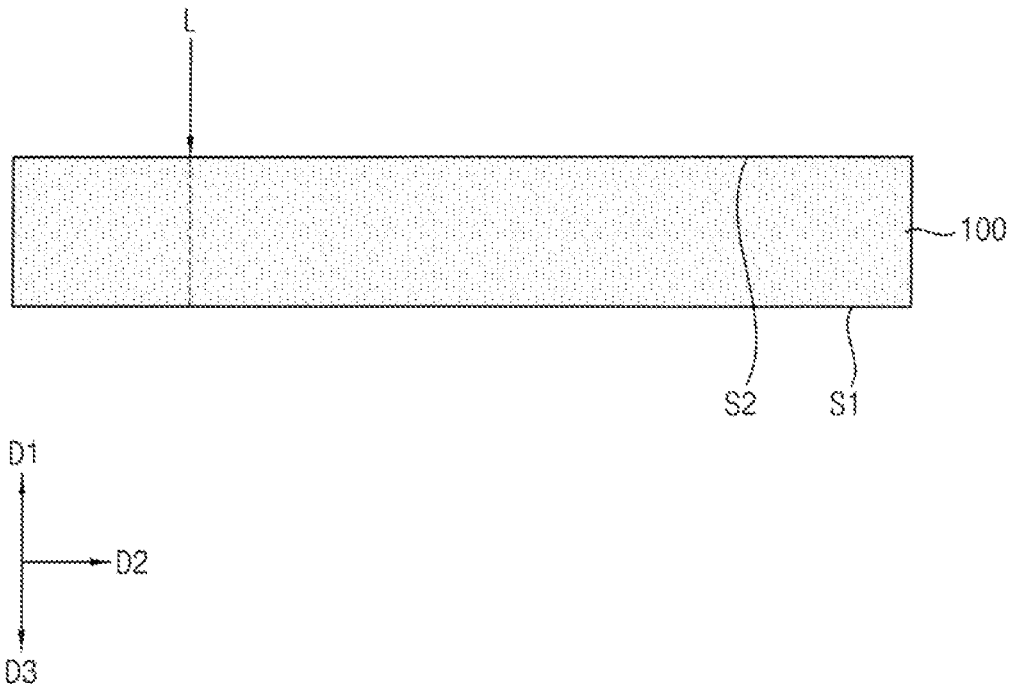
FIG. 18 to FIG. 27 are cross-sectional views that illustrate a method for manufacturing a display device of FIG. 17.

Referring to FIGS. 17 and 18, according to embodiments, a laser L is irradiated to the first substrate 100. In detail, the laser L is irradiated to an area where the hole 300 is to be formed. The laser L selectively weakens the intermolecular bonding forces of the irradiated area of the first substrate 100. Accordingly, the hole 300 is smoothly formed. Therefore, in a method according to embodiments, no mask is required while performing a wet etching process.

Figure 19:
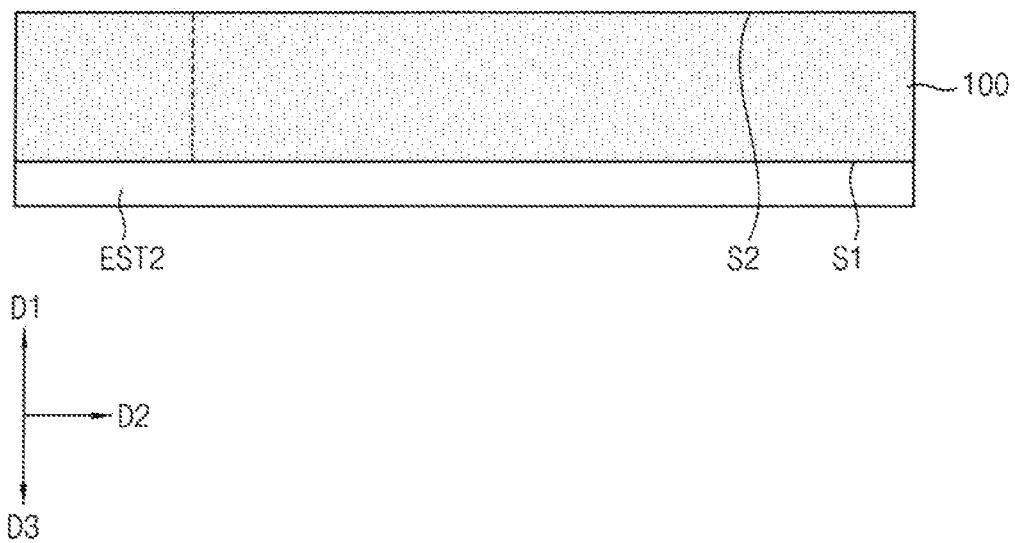

Referring to FIGS. 17 and 19, according to embodiments, the etch stopper EST2 is formed on the first surface S1 of the first substrate 100. In an embodiment, as shown in FIG. 19, the etch stopper EST2 is deposited on the first substrate 100 and entirely overlaps the first substrate 100.

Figure 20:
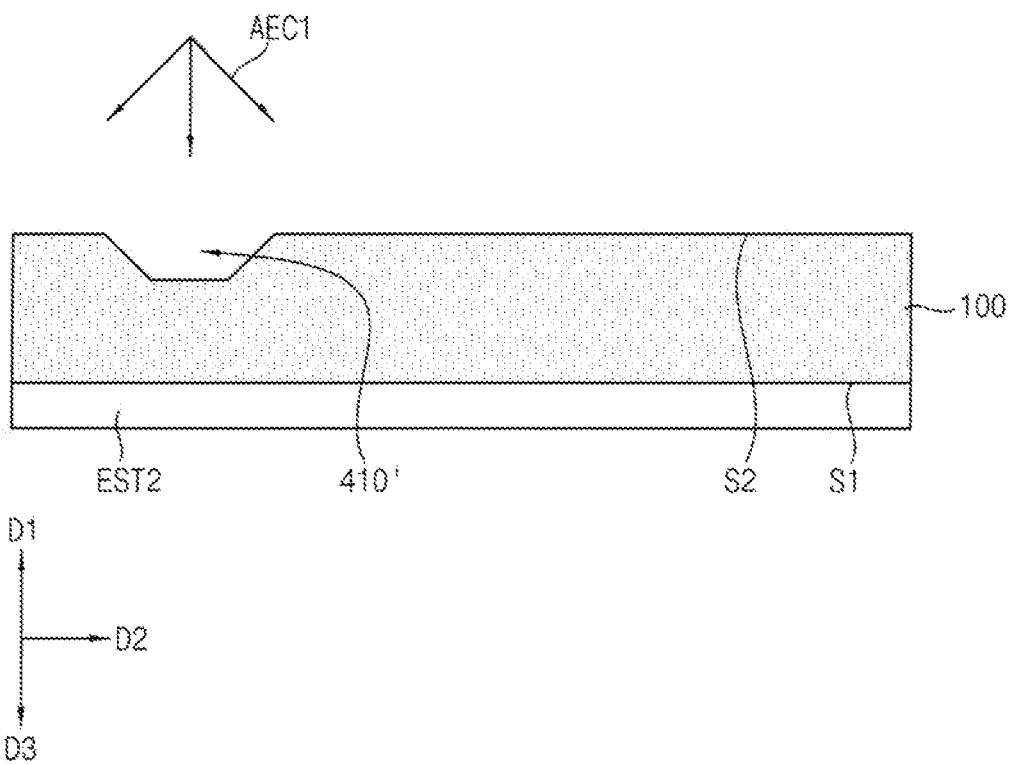

Referring to FIGS. 17 and 20, according to embodiments, a first wet etching process that uses a first etchant AEC1 is performed. In an embodiment, the pH of the first etchant AEC1 is less than 7. In other words, the first etchant AEC1 is the acidic etchant. When the first etchant AEC1 reacts with the first substrate 100, a first hole 410' that extends into the first substrate and exposes the inside of the first substrate 100 is formed at a spot irradiated by the laser. After the first hole 410' is formed, the first substrate 100 is cleaned using a cleaning solution. Accordingly, any first etchant AEC1 that remains on the first substrate 100 can be removed.

Figure 21:
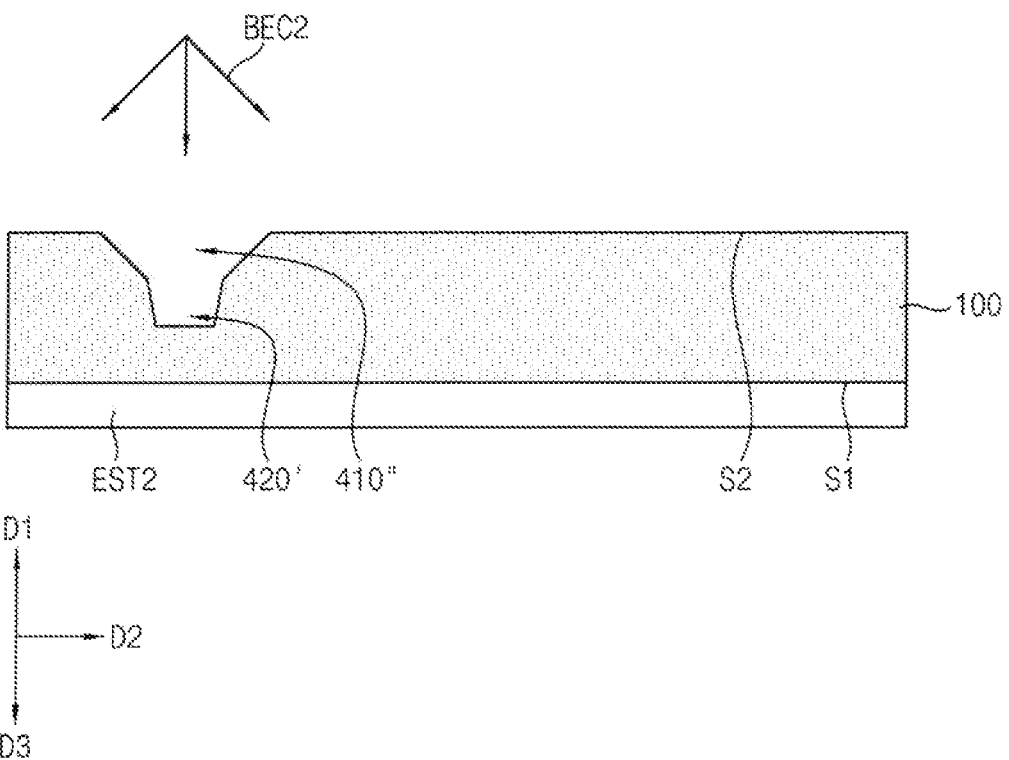

Referring to FIGS. 17 and 21, according to embodiments, a second wet etching process that uses the second etchant BEC2 is performed. In an embodiment, the pH of the second etching solution BEC2 is greater than 7. In other words, the second etchant BEC2 is the basic etchant. When the second etchant BEC2 reacts with the first substrate 100, the first hole 410' is widened into a first hole 410" and a second hole 420' connected to the first hole 410" is formed. The second hole 420' extends further into the first substrate 100 from the first hole 410". After the second hole 420' is formed, the first substrate 100 is cleaned using a cleaning solution. Accordingly, any second etchant BEC2 that remains on the first substrate 100 can be removed.

Figure 22:
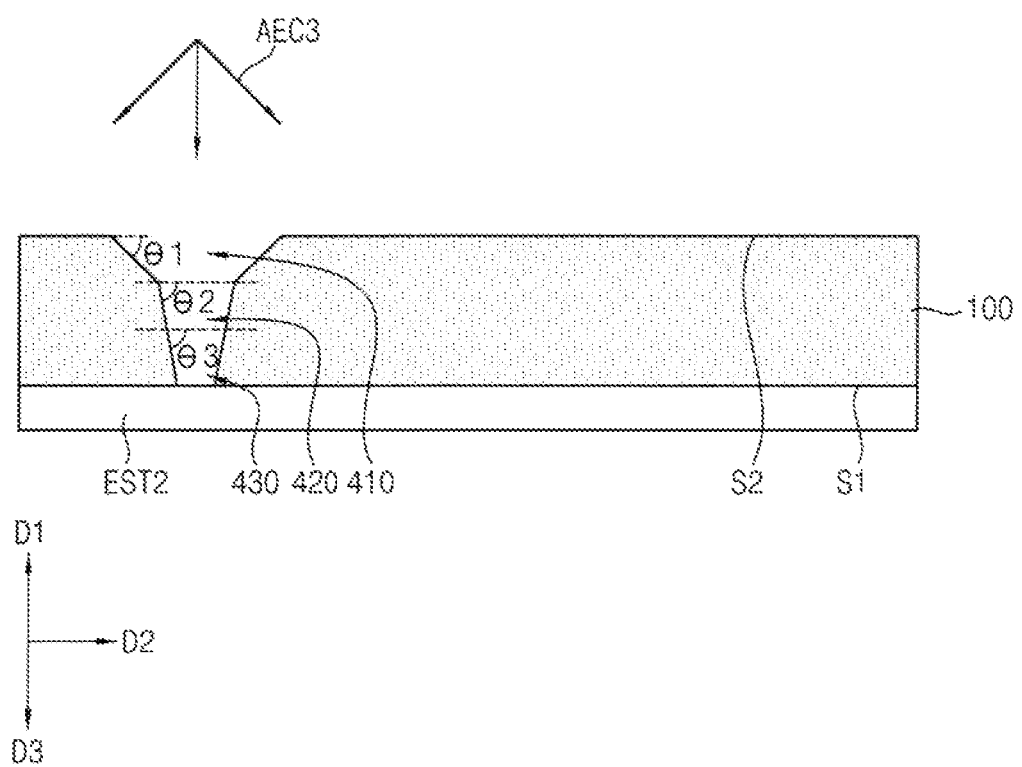

Referring to FIGS. 17 and 22, according to embodiments, a third wet etching process is performed using a third etchant AEC3. In an embodiment, the pH of the third etchant AEC3 is less than 7. For example, the third etchant AEC3 is the same as the first etchant AEC1. When the third etchant AEC3 reacts with the first substrate 100, a first hole 410, a second hole 420, and a third hole 430 are formed. The third hole 430 extends further into the first substrate 100 from the second hole 420, and exposes the inside of the first substrate 100.

In an embodiment, the first substrate 100 is penetrated by the first to third holes 410, 420, and 430. In other words, the upper surface of the first hole 410 coincides with the second surface S2 of the first substrate 100, the lower edge of the first hole 410 coincides with the upper edge of the second hole 420, the lower edge of the second hole 420 coincides with the upper edge of the third hole 430, and the lower surface of the third hole 430 coincides with the first surface S1 of the first substrate 100. In this case, a surface of the etch stopper EST2 in contact with the first substrate 100 is exposed by the third hole 430.

In an embodiment, a first taper angle θ1 formed between the upper surface of the first hole 410 and the side surface of the first hole 410 and a second taper angle θ2 formed between a plane parallel to the second surface S2 or the first surface S1 of the first substrate 100 and the side surface of the second hole 420 differ from each other. In addition, the second taper angle θ2 and a third taper angle θ3 formed between a plane parallel to the second surface S2 or the first surface S1 of the first substrate 100 and the side surface of the third hole 430 differ from each other. In other words, the side surface of the first hole 410, the side surface of the second hole 420, and the side surface of the third hole 430 have different inclinations from each other.

Figure 23:
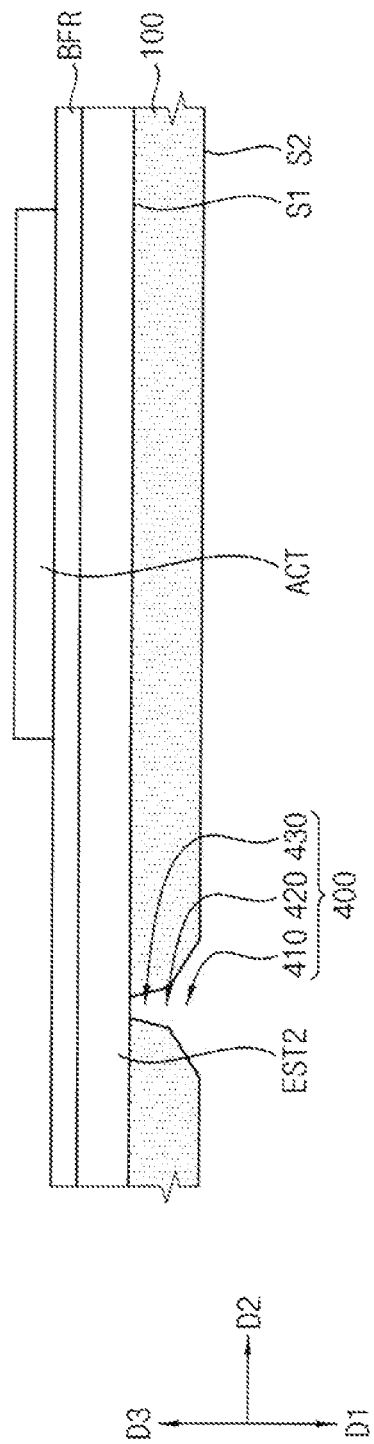

Referring to FIGS. 17 and 23, according to embodiments, the buffer layer BFR and the active pattern ACT are formed on a surface of the etch stopper EST2 opposite to the first surface S1 of the first substrate 100.

Figure 24:
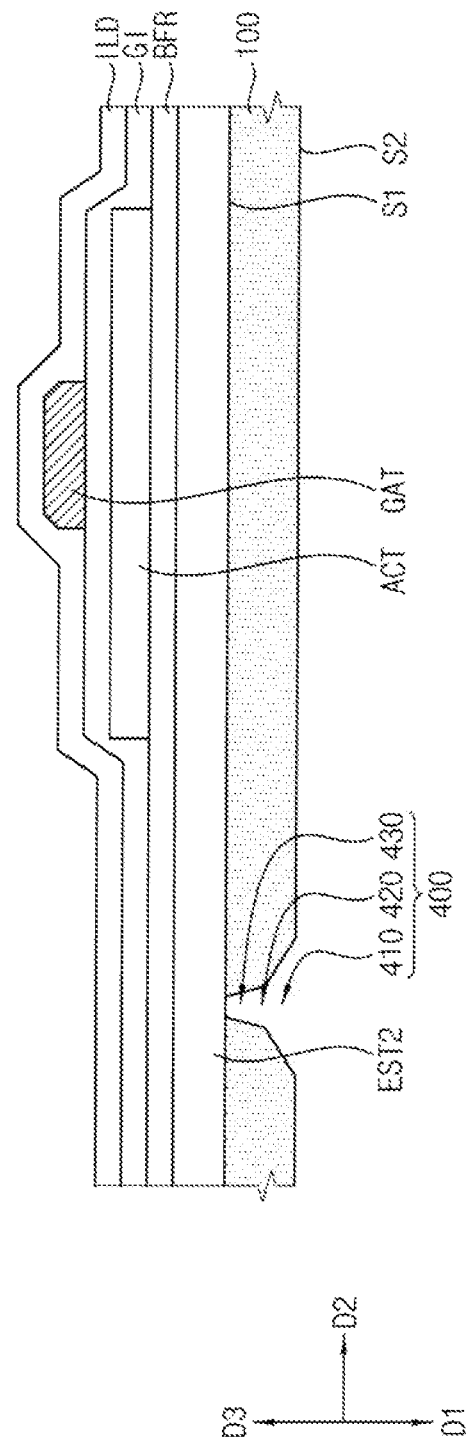

Referring to FIGS. 17 and 24, according to embodiments, the gate insulating layer GI is formed on the buffer layer BFR and active pattern ACT, the gate electrode GAT is formed on the gate insulating layer GI, and the interlayer insulating layer ILD is formed on the gate insulating layer GI and covers the gate electrode GAT.

Figure 25:
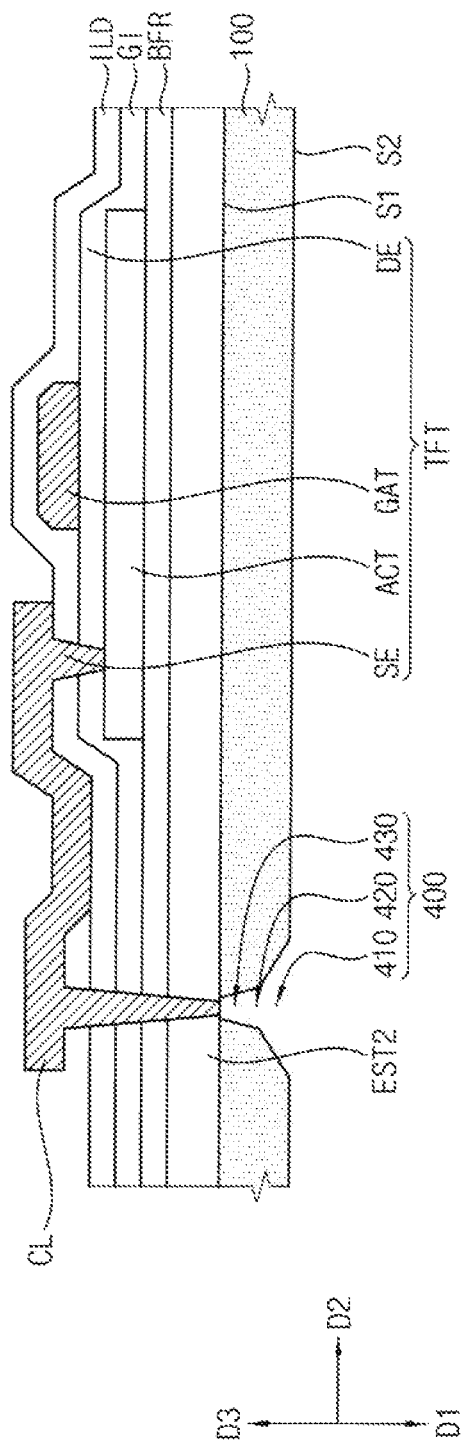

Referring to FIGS. 17 and 25, according to embodiments, after the first to third contact holes are formed in the buffer layer BFR, the gate insulating layer GI, and the interlayer insulating layer ILD, the source electrode SE, the drain electrode DE, and the connection line CL are formed. Accordingly, the source electrode SE contacts the source region of the active pattern ACT, the drain electrode DE contacts the drain region of the active pattern ACT, and the connection line CL contacts the first surface S1 of the first substrate 100 and connects to the source electrode.

Figure 26:
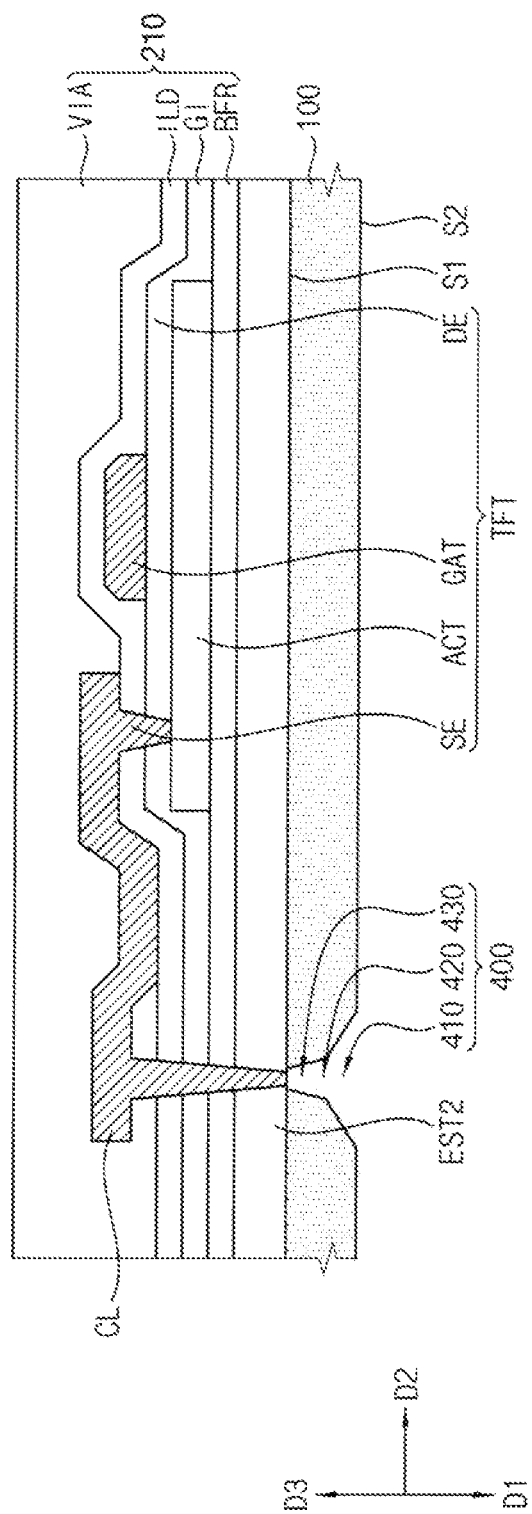

Referring to FIGS. 17 and 26, according to embodiments, the via insulating layer VIA is formed on the interlayer insulating layer ILD and that covers the connection line CL, the source electrode SE, and the drain electrode DE. In other words, the transistor layer 210 is formed.

Figure 27:
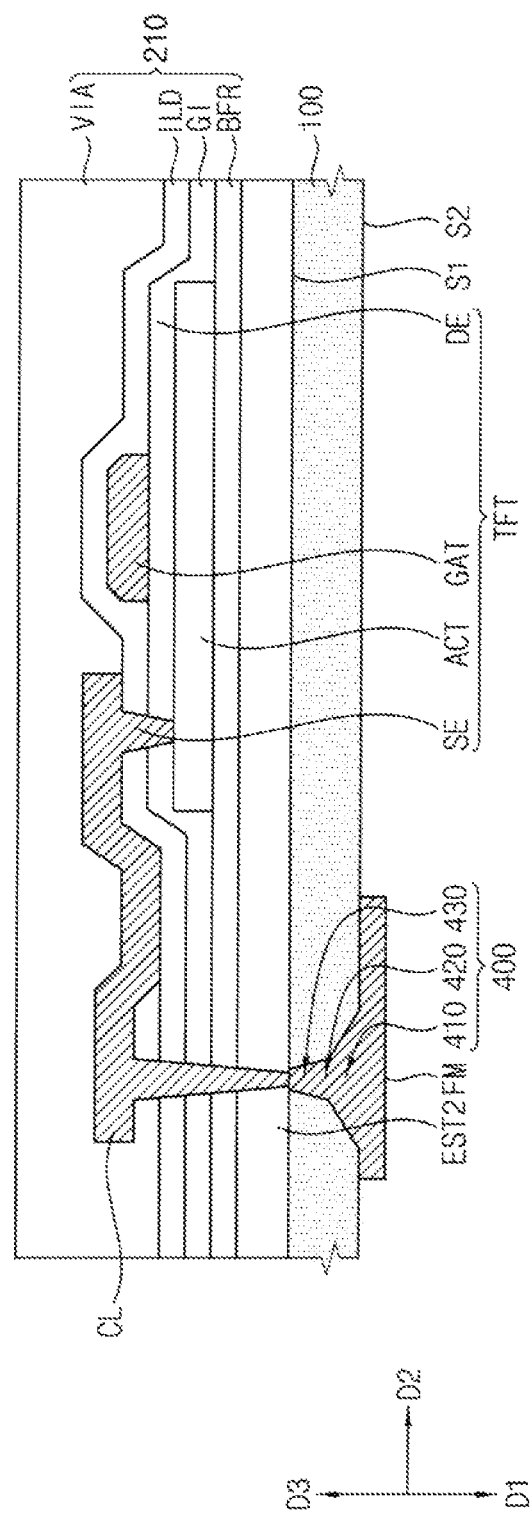

Referring to FIGS. 17 and 27, according to embodiments, the filling metal FM is formed inside of the hole 400. For example, the filling metal FM may be formed by a method such as low pressure chemical vapor deposition (LPCVD), atmospheric pressure chemical vapor deposition (APCVD), plasma enhanced chemical vapor deposition (PECVD), sputtering, or vacuum deposition, etc. The filling metal FM fills the inside of the hole 400 and contacts the connection line CL.

According to embodiments, although FIG. 17 shows the hole 400 as including the first to third holes 410, 420, and 430, embodiments of the present disclosure are not limited thereto. For example, the hole 400 does not include the third hole 430.

In detail, according to embodiments, the hole 400 includes only the first hole 410 and the second hole 420. For example, the first substrate 100 is penetrated by the first and second holes 410 and 420. In other words, the upper surface of the first hole 410 coincides with the second surface S2 of the first substrate 100, the lower edge of the first hole 410 coincides with the upper edge of the second hole 420, and the lower surface of the second hole 420 coincides with the first surface S1 of the first substrate 100. In addition, to form the first and second holes 410 and 420, only a first wet etching process that uses the first etchant AEC1 and a second wet etching process that uses the second etchant BEC2 are performed.

According to embodiments, the third wet etching process that forms the third hole 430 may be omitted depending on the process conditions. For example, the third wet etching process may be omitted depending on the material of the etch stopper. In detail, when the etch stopper includes a material, such as a metal or an inorganic material, that can resist the basic etchant, the third wet etching process that uses the third etchant AEC3 is omitted.

In addition, according to embodiments, the order of performing the method steps is not limited to the above. For example, referring to FIGS. 22 to 26, after the hole 400 is formed, the transistor layer 210 is formed. For another example, after the transistor layer 210 is formed, the hole 400 is formed. The order described with reference to FIGS. 18 to 27 is merely an example of various procedures that can perform a method according to embodiments, and those of ordinary skill in the art can appropriately change the order.

In a method for manufacturing the display device 1000 according to embodiments of the present disclosure, a first hole is formed in a substrate through a first wet etching process using a first etchant, and a second hole that is connected to the first hole is formed through a second wet etching process using a second etchant that has a pH that differs from that of the first etchant. The substrate is penetrated by a hole that includes the first hole and the second hole. Since the hole is formed differently according to the pH of the etchant, a hole having a desired shape can be formed using etchants having different pHs. For example, a hole having a desired taper angle and a desired width can be formed. Accordingly, a filling metal is easily formed inside the hole, and the spacing between the holes can be reduced. Therefore, since the display device 1000 includes a display panel disposed on the first surface of the substrate and the driving member disposed on the second surface of the substrate, a bezel of the display device 1000 can be reduced.

Although certain exemplary embodiments have been described herein, other embodiments and modifications will be apparent from this description. Accordingly, embodiments of the inventive concepts are not limited to such embodiments, but rather to a broader scope of the appended claims and various obvious modifications and equivalent arrangements as would be apparent to a person of ordinary skill in the art.

What is claimed is:

1. A method for manufacturing a display device, the method comprising:
    forming a first hole that extends into a substrate from a first surface, through a first wet etching process that uses a first etchant, wherein the first hole is surrounded by the substrate;
    forming a second hole that extends from the first hole further into the substrate, through a second wet etching process that uses a second etchant, wherein the second hole is surrounded by the substrate, wherein the second etchant has a pH that differs from a pH of the first etchant, wherein the pH of the first etchant is basic and the pH of the second etchant is acidic;
    forming an etch stopper on the substrate on a second surface of the substrate that is opposite to the first surface, wherein a surface of the etch stopper contacts the substrate; and
    forming a buffer layer on the substrate and etch stopper, wherein the buffer layer covers the etch stopper.

2. The method of claim 1, wherein the first hole and the second hole penetrate the substrate and the surface of the etch stopper is exposed by the second hole.

3. The method of claim 1, further comprising:
    forming a filling metal that fills an inside of the first and second holes.

4. The method of claim 1, further comprising:
    irradiating the substrate with a laser, before forming the first hole in the substrate.

5. The method of claim 1, wherein the first etchant includes potassium hydroxide, and the second etchant includes hydrofluoric acid.

6. The method of claim 1, further comprising:
    forming a third hole that extends further into the substrate from the second hole, through a third wet etching process that uses a third etchant having a pH that is basic.

7. The method of claim 6, wherein the third etchant is a same as the first etchant.

8. The method of claim 6, wherein the first hole, the second hole, and the third hole together penetrate the substrate, and the surface of the etch stopper is exposed by the third hole.

9. The method of claim 6, wherein the etch stopper includes one of a metal or an inorganic material.

10. A method for manufacturing a display device, the method comprising:
    forming a first hole that extends into a substrate from a first surface, through a first wet etching process that uses a first etchant, wherein the first hole is surrounded by the substrate;
    forming a second hole that extends from the first hole further into the substrate, through a second wet etching process that uses a second etchant, wherein the second hole is surrounded by the substrate;
    forming a third hole that extends further into the substrate from the second hole, through a third wet etching process using a third etchant, wherein the pH of the first etchant is less than 7, the pH of the second etchant is greater than 7, and the pH of the third etchant is less than 7;
    forming an etch stopper on the substrate on a second surface of the substrate that is opposite to the first surface, wherein a surface of the etch stopper contacts the substrate; and
    forming a buffer layer on the substrate and etch stopper, wherein the buffer layer covers the etch stopper.

11. The method of claim 10, wherein the second etchant includes potassium hydroxide, and the first etchant includes hydrofluoric acid.

12. The method of claim 10, wherein the third etchant is a same as the first etchant.

13. The method of claim 10, wherein the first hole, the second hole, and the third hole together penetrate the substrate, and the surface of the etch stopper is exposed by the third hole.

14. The method of claim 10, wherein the etch stopper includes an organic material.

15. A method for manufacturing an electronic device, the method comprising:
    irradiating a substrate with a laser;

forming a hole in the substrate at a spot in the substrate irradiated by the laser, wherein the hole includes a first hole that extends into the substrate and is formed through a first wet etching process that uses a first etchant and a second hole that extends from the first hole further into the substrate and is formed through a second wet etching process that uses a second etchant;

forming an etch stopper on the substrate, wherein a surface of the etch stopper contacts the substrate; and forming a buffer layer on the substrate and etch stopper, wherein the buffer layer covers the etch stopper, wherein the hole penetrates the substrate and the surface of the etch stopper is exposed by the hole, wherein the pH of the first etchant is basic and the pH of the second etchant is acidic.

* * * * *